(12) United States Patent
Chrostowski et al.

(10) Patent No.: US 12,199,398 B2
(45) Date of Patent: Jan. 14, 2025

(54) METHOD AND CIRCUIT FOR REFLECTION CANCELLATION

(71) Applicant: The University of British Columbia, Vancouver (CA)

(72) Inventors: Lukas Chrostowski, Vancouver (CA); Nicolas A. F. Jaeger, Vancouver (CA); Sudip Shekhar, Vancouver (CA); Hasitha Jayatilleka, Vancouver (CA); Hossam A. S. Shoman, Vancouver (CA)

(73) Assignee: The University of British Columbia, Vancouver (CA)

( * ) Notice: Subject to any disclaimer, the term of this patent is extended or adjusted under 35 U.S.C. 154(b) by 689 days.

(21) Appl. No.: 17/352,066

(22) Filed: Jun. 18, 2021

(65) Prior Publication Data

US 2021/0313757 A1 Oct. 7, 2021

Related U.S. Application Data

(63) Continuation-in-part of application No. PCT/CA2019/051894, filed on Dec. 20, 2019.

(Continued)

(51) Int. Cl.
*H01S 5/00* (2006.01)
*H01S 3/13* (2006.01)
*H01S 5/0683* (2006.01)

(52) U.S. Cl.
CPC .......... *H01S 3/1307* (2013.01); *H01S 3/1305* (2013.01); *H01S 5/0064* (2013.01); *H01S 5/0683* (2013.01); *H01S 5/0078* (2013.01)

(58) Field of Classification Search
CPC ..... H01S 5/0683; H01S 5/0064; H01S 5/0078
See application file for complete search history.

(56) References Cited

U.S. PATENT DOCUMENTS 6,891,870 B2 5/2005 Sahara et al.
2018/0292680 A1* 10/2018 Baehr-Jones ...... G02B 6/02204

FOREIGN PATENT DOCUMENTS

| EP | 2084914 | 8/2009 |
|----|---------|--------|
| EP | 2850733 | 3/2015 |
| WO | WO 2018/045454 | 3/2018 |

OTHER PUBLICATIONS

P. Pintus, D. Huang, C. Zhang, Y. Shoji, T. Mizumoto, and J. E. Bowers, "Microring-based optical isolator and circulator with integrated electromagnet for silicon photonics," Journal of Lightwave Technology, vol. 35, No. 8, pp. 1429-1437, 2017.

(Continued)

*Primary Examiner* — Michael Carter

(57) ABSTRACT

Methods, circuits, and techniques for reflection cancellation. Laser output is tapped. A tapped portion of the laser output is phase shifted to generate a feedback signal, with the feedback signal being out-of-phase with a parasitic reflection of the laser output. The feedback signal is directed towards the laser such that the parasitic reflection and feedback signal are superpositioned before entering the laser. A magnitude and a phase of the feedback signal are such that superposition of the feedback signal and the parasitic reflection results in a resulting signal of lower magnitude than the parasitic reflection alone. During laser operation, a magnitude of the resulting signal is monitored and, as the parasitic reflection varies, the magnitude of the resulting signal is adjusted by adjusting at least one of the magnitude and the phase of the feedback signal in response to the monitoring of the resulting signal.

42 Claims, 18 Drawing Sheets

Related U.S. Application Data

(60) Provisional application No. 63/043,740, filed on Jun. 24, 2020, provisional application No. 62/782,632, filed on Dec. 20, 2018.

(56) References Cited

OTHER PUBLICATIONS

Y. Shoji and T. Mizumoto, "Magneto-optical non-reciprocal devices in silicon photonics," Science and technology of advanced materials, vol. 15, No. 1, p. 014602, 2014.

L. Bi, J. Hu, P. Jiang, D. H. Kim, G. F. Dionne, L. C. Kimerling, and C. Ross, "On-chip optical isolation in monolithically integrated non-reciprocal optical resonators," Nature Photonics, vol. 5, No. 12, p. 758, 2011.

C. Doerr, L. Chen, and D. Vermeulen, "Silicon photonics broadband modulation-based isolator," Optics express, vol. 22, No. 4, pp. 4493-4498, 2014.

P. Dong, "Travelling-wave mach-zehnder modulators functioning as optical isolators," Optics express, vol. 23, No. 8, pp. 10 498-10 505, 2015.

P. Alipour, "Reconfigurable integrated photonic circuits on silicon," Ph.D. dissertation, Georgia Institute of Technology, 2014.

P. Alipour, A. A. Eftekhar, A. H. Atabaki, and A. Adibi, "Thermally reconfigurable device for adaptive reflection suppression on a silicon-on-insulator platform," Optics letters, vol. 39, No. 5, pp. 1141-1144, 2014.

Hauck Johannes et al.: "Stabilization and Frequency Control of a DFB Laser With a Tunable Optical Reflector Integrated in a Silicon Photonics PIC", Journal of Lightwave Technology, IEEE, USA, vol. 34, No. 23, Dec. 1, 2016, pp. 5467-5473.

Brahim S K et al.: "Non-magnetic 30 dB integrated optical isolator in III/V material", Electronics Letters, The Institution of Engineering and Technology, GB, vol. 40, No. 20, Sep. 30, 2004, pp. 1293-1294.

Supplementary European Search Report on corresponding European application No. 19899476.6, Jul. 26, 2022.

\* cited by examiner

METHOD AND CIRCUIT FOR REFLECTION CANCELLATION

CROSS-REFERENCE TO RELATED APPLICATIONS

This application is a continuation-in-part of International Application No. PCT/CA2019/051894, filed on Dec. 20, 2019, which claims priority to U.S. Provisional Application No. 62/782,632, filed on Dec. 20, 2018. This application also claims priority to U.S. Provisional Application No. 63/043,740, filed on Jun. 24, 2020. The entireties of International Application No. PCT/CA2019/051894, U.S. Provisional Application No. 62/782,632, and U.S. Provisional Application No. 63/043,740 are hereby incorporated by reference.

TECHNICAL FIELD

The present disclosure is directed at methods, circuits, and techniques for reflection cancellation.

BACKGROUND

A stable laser light source is important for many photonics related applications, such as in data transfer and telecommunication systems. One significant cause of laser instability is light reflecting back into a laser, such as due to downstream devices in the system.

SUMMARY

According to a first aspect, there is provided a reflection cancellation method, comprising: tapping laser output from a laser; generating a feedback signal by phase shifting a tapped portion of the laser output, wherein the feedback signal is out-of-phase with a parasitic reflection of the laser output; directing the feedback signal to the laser such that the parasitic reflection and feedback signal are superpositioned, wherein a magnitude and a phase of the feedback signal are such that superposition of the feedback signal and the parasitic reflection results in a resulting signal of lower magnitude than the parasitic reflection entering the laser; monitoring a magnitude of the resulting signal; and reducing the magnitude of the resulting signal by adjusting at least one of the magnitude and the phase of the feedback signal in response to the monitoring.

Adjusting the at least one of the magnitude and the phase of the feedback signal may comprise adjusting an amount of the laser output that is tapped to generate the feedback signal in response to the monitoring.

Adjusting the at least one of the magnitude and the phase of the feedback signal may comprise adjusting a phase shift imparted to the feedback signal during the phase shifting.

One of the magnitude and the phase of the feedback signal may be adjusted while the other of the magnitude and the phase of the feedback signal is held constant.

The magnitude and the phase of the feedback signal may be concurrently adjusted.

The tapping may be performed using a tunable tap that comprises a first output to a source of the parasitic reflection and a second output to a phase shifter that performs the phase shifting, and the method may further comprise: as between the first and second outputs, directing the laser output entirely to the first output; measuring a magnitude of the parasitic reflection entering the laser while the laser output is entirely directed to the first output; attenuating the laser output downstream from the first output and upstream of the source of the parasitic reflection, without attenuating the tapped portion from the second output; and while the laser output is being attenuated, tuning the magnitude of the feedback signal to approach the magnitude of the parasitic reflection measured while the laser output is entirely directed to the first output.

Attenuating the laser output from the first output may comprise preventing any of the laser output from reaching the source of the parasitic reflection, and the magnitude of the feedback signal may be tuned until the magnitude of the feedback signal equals the magnitude of the parasitic reflection measured while the laser output is entirely directed to the first output.

Directing the laser output entirely to the first output may comprise adjusting the tunable tap until a second photocurrent generated by measuring the feedback signal is minimized.

The magnitude of the feedback signal may be tuned until a first photocurrent generated by measuring the resulting signal equals a value determined using: the second photocurrent; a fourth photocurrent generated by measuring the laser output from the first output to the source of the parasitic reflection: during the tuning of the feedback signal; and when the second photocurrent is minimized; and the first photocurrent when the second photocurrent is minimized.

The magnitude of the feedback signal may be tuned until:

$$I_{PD_1} = \frac{a_1}{a_4} \frac{(I_{PD_4})^2}{I_{PD_2} + I_{PD_4}},$$

wherein $I_{PD1}$ is the first photocurrent, $I_{PD2}$ is the second photocurrent, $I_{PD4}$ is the fourth photocurrent during the tuning of the feedback signal, $a_1$ is the first photocurrent when the second photocurrent is minimized, and $a_4$ is the fourth photocurrent when the second photocurrent is minimized.

The tapping may be performed using a tunable tap that comprises a first output to a source of the parasitic reflection and a second output to a phase shifter that performs the phase shifting, and the method may further comprise: determining when a first photocurrent generated by measuring the resulting signal is above a minimum of the first photocurrent; and when the first photocurrent generated by measuring the resulting signal is above the minimum of the first photocurrent, adjusting the tunable tap to tune the magnitude of the feedback signal.

The magnitude of the feedback signal may be tuned by adjusting the tunable tap until a second photocurrent generated by measuring the feedback signal during the tuning of the feedback signal equals a value determined using: a third photocurrent generated by measuring the parasitic reflection: during the tuning of the feedback signal; and at the minimum of the first photocurrent; a fourth photocurrent generated by measuring the laser output from the first output to the source of the parasitic reflection: during the tuning of the feedback signal; and at the minimum of the first photocurrent; and the second photocurrent generated at the minimum of the first photocurrent.

The magnitude of the feedback signal may be tuned until:

$$I_{PD_2} = b_2 \sqrt{\frac{I_{PD_3} I_{PD_4}}{b_3 b_4}},$$

wherein $I_{PD2}$ is the second photocurrent during the tuning of the feedback signal, $b_2$ is the second photocurrent at the minimum of the first photocurrent, $b_3$ is the third photocurrent at the minimum of the first photocurrent, $b_4$ is the fourth photocurrent at the minimum of the first photocurrent, $I_{PD3}$ is the third photocurrent during the tuning of the feedback signal, and $I_{PD4}$ is the fourth photocurrent during the tuning of the feedback signal.

The reflection cancellation method may further comprise, after tuning the magnitude of the feedback signal, tuning the phase of the feedback signal to approach the minimum of the first photocurrent.

The reflection cancellation method may further comprise, before tuning the magnitude of the feedback signal, tuning the phase of the feedback signal to approach the minimum of the first photocurrent.

The phase of the feedback signal may be tuned until the first photocurrent returns to the minimum of the first photocurrent.

The reflection cancellation method may further comprise filtering the parasitic reflection before the parasitic reflection enters the laser using a filter tuned to a modulation frequency of the laser output and having a bandwidth of less than twice the modulation frequency.

According to another aspect, there is provided a reflection cancellation circuit, comprising: a tunable tap optically coupled to a laser to receive laser output therefrom; a phase shifter optically coupled to the tunable tap to receive a tapped portion of the laser output; a mirror optically coupled to the phase shifter and positioned to reflect a feedback signal back towards the laser; a first photodetector optically coupled to monitor a magnitude of the resulting signal and generate a corresponding first photocurrent; and a control circuit communicatively coupled to the tunable tap, the phase shifter, and the first photodetector, wherein the control circuit is configured to perform a method comprising: tapping the laser output using the tunable tap; using the phase shifter, generating the feedback signal by phase shifting a tapped portion of the laser output, wherein a magnitude and a phase of the feedback signal are such that superposition of the feedback signal and the parasitic reflection results in a resulting signal of lower magnitude than the parasitic reflection entering the laser; and in response to the first photocurrent, reducing the magnitude of the resulting signal by adjusting at least one of the magnitude and the phase of the feedback signal by respectively adjusting at least one of the tunable tap and the phase shifter.

The tunable tap may comprises a Mach-Zehnder interferometer.

The tunable tap may comprise a ring resonator.

The photodetector may be optically coupled using a fixed tap.

The photodetector may be optically coupled using a tunable power tap.

The photodetector may be optically coupled using a tunable power tap and extra photodetectors may be used to monitor the power coupling of the tunable power tap.

The tunable power tap for the photodetector may comprise a Mach-Zehnder interferometer.

The tunable power tap for the photodetector may comprise a ring resonator interferometer.

Adjusting the at least one of the magnitude and the phase of the feedback signal may comprise adjusting the tunable tap.

Adjusting the at least one of the magnitude and the phase of the feedback signal may comprise adjusting a phase shift imparted to the feedback signal by the phase shifter.

One of the magnitude and the phase of the feedback signal may be adjusted while the other of the magnitude and the phase of the feedback signal is held constant.

The magnitude and the phase of the feedback signal may be concurrently adjusted.

The tunable tap may comprise a first output to a source of the parasitic reflection and a second output to the phase shifter, and the circuit may further comprise a first optical attenuator optically coupled between the first output and the source of the parasitic reflection, and the method may further comprise: as between the first and second outputs, directing the laser output entirely to the first output; using the first photodetector, measuring a magnitude of the parasitic reflection entering the laser while the laser output is entirely directed to the first output; attenuating the laser output using the first optical attenuator; and while the laser output is being attenuated, tuning the magnitude of the feedback signal using the tunable tap to approach the magnitude of the parasitic reflection measured while the laser output is entirely directed to the first output.

Attenuating the laser output may prevent any of the laser output from reaching the source of the parasitic reflection, and the magnitude of the feedback signal may be tuned until the magnitude of the feedback signal equals the magnitude of the parasitic reflection measured while the laser output is entirely directed to the first output.

The reflection cancellation circuit may further comprise a second photodetector optically coupled between the tunable tap and the mirror to monitor a magnitude of the feedback signal and generate a corresponding second photocurrent, the second photodetector and the control circuit may be communicatively coupled, and directing the laser output entirely to the first output may comprise adjusting the tunable tap until the second photocurrent is minimized.

The reflection cancellation circuit may further comprise a fourth photodetector optically coupled between the first output and the source of the parasitic reflection to monitor the laser output from the first output to the source of the parasitic reflection and generate a corresponding fourth photocurrent, the fourth photodetector may be communicatively coupled to the control circuit, and the magnitude of the feedback signal may be tuned until the first photocurrent equals a value determined using: the second photocurrent; the fourth photocurrent: during the tuning of the feedback signal; and when the second photocurrent is minimized; and the first photocurrent when the second photocurrent is minimized.

The magnitude of the feedback signal may be tuned until:

$$I_{PD_1} = \frac{a_1}{a_4} \frac{(I_{PD_4})^2}{I_{PD_2} + I_{PD_4}},$$

wherein $I_{PD1}$ is the first photocurrent, $I_{PD2}$ is the second photocurrent, $I_{PD4}$ is the fourth photocurrent during the tuning of the feedback signal, $a_1$ is the first photocurrent when the second photocurrent is minimized, and $a_4$ is the fourth photocurrent when the second photocurrent is minimized.

The tunable tap may comprise a first output to a source of the parasitic reflection and a second output to the phase shifter, and the method may further comprise: determining when the first photocurrent is above a minimum of the first photocurrent; and when the first photocurrent is above the minimum of the first photocurrent, adjusting the tunable tap to tune the magnitude of the feedback signal.

The reflection cancellation circuit may further comprise: a second photodetector optically coupled between the tunable tap and the mirror to monitor a magnitude of the feedback signal and generate a corresponding second photocurrent; a third photodetector optically coupled between the first output and the source of the parasitic reflection to monitor the parasitic reflection and generate a corresponding third photocurrent; a fourth photodetector optically coupled between the first output and the source of the parasitic reflection to monitor the laser output from the first output to the source of the parasitic reflection and generate a corresponding fourth photocurrent; each of the second, third, and fourth photodetectors may be each communicatively coupled to the control circuit, and the magnitude of the feedback signal may be tuned by adjusting the tunable tap until the second photocurrent equals a value determined using: the third photocurrent: during the tuning of the feedback signal; and at the minimum of the first photocurrent; the fourth photocurrent: during the tuning of the feedback signal; and at the minimum of the first photocurrent; and the second photocurrent generated at the minimum of the first photocurrent.

The magnitude of the feedback signal may be tuned until:

$$I_{PD_2} = b_2 \sqrt{\frac{I_{PD_3} I_{PD_4}}{b_3 b_4}},$$

wherein $I_{PD2}$ is the second photocurrent during the tuning of the feedback signal, $b_2$ is the second photocurrent at the minimum of the first photocurrent, $b_3$ is the third photocurrent at the minimum of the first photocurrent, $b_4$ is the fourth photocurrent at the minimum of the first photocurrent, $I_{PD3}$ is the third photocurrent during the tuning of the feedback signal, and $I_{PD4}$ is the fourth photocurrent during the tuning of the feedback signal.

The method may further comprise, after tuning the magnitude of the feedback signal, tuning the phase of the feedback signal to approach the minimum of the first photocurrent.

The method may further comprise, before tuning the magnitude of the feedback signal, tuning the phase of the feedback signal to approach the minimum of the first photocurrent.

The phase of the feedback signal may be tuned until the first photocurrent returns to the minimum of the first photocurrent.

The reflection cancellation circuit may further comprise a filter tuned to a modulation frequency of the laser and optically coupled to filter the parasitic reflection before the parasitic reflection enters the laser, and the filter may have a bandwidth of less than twice the modulation frequency.

According to another aspect, there is provided a control circuit configured to perform any of the foregoing aspects of the method or suitable combinations thereof.

This summary does not necessarily describe the entire scope of all aspects. Other aspects, features and advantages will be apparent to those of ordinary skill in the art upon review of the following description of specific embodiments.

BRIEF DESCRIPTION OF THE DRAWINGS

In the accompanying drawings, which illustrate one or more example embodiments.

DETAILED DESCRIPTION

Figure 1A:
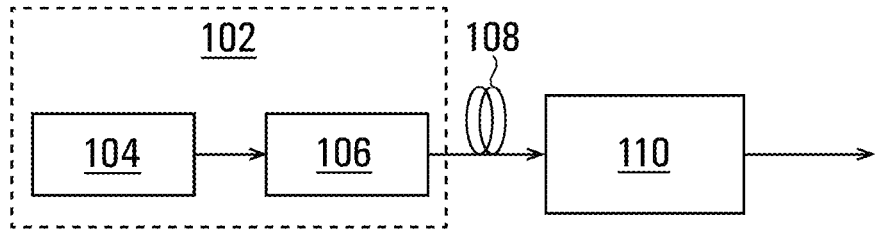
FIG. 1A depicts a silicon photonic chip optically coupled to an off-chip optical isolator, according to the prior art.

In photonics related applications, reflections can cause functionality or performance issues, and lead to yield reductions. Hence, conventional practical implementations typically use optical isolators (e.g., optical diodes, which only allow light transmission in one direction) at the output of a laser. More particularly, these implementations may use a packaging solution for off-chip magneto-optical isolators with integrated photonics products, such as shown in FIG. 1A. In FIG. 1A, a silicon photonic chip 102 comprises a laser 104 optically coupled to a silicon photonic transmitter 106. An optical isolator 110 is optically coupled to the transmitter's 106 output via an optical waveguide 108, such as optical fiber. However, a true optical isolator is used in conjunction with magneto-optical materials, which are extremely costly, and not readily integrated onto standard planar silicon photonic platforms as shown in FIG. 1A. This may raise the additional problem of compromising the form factor of a silicon photonics product. Furthermore, since an off-chip solution such as the isolator 110 is likely to be included after several on-chip circuits (e.g., the transmitter 106 in FIG. 1A), such a solution would not isolate the laser 104 from reflections due to the on-chip circuits.

Figure 1B:
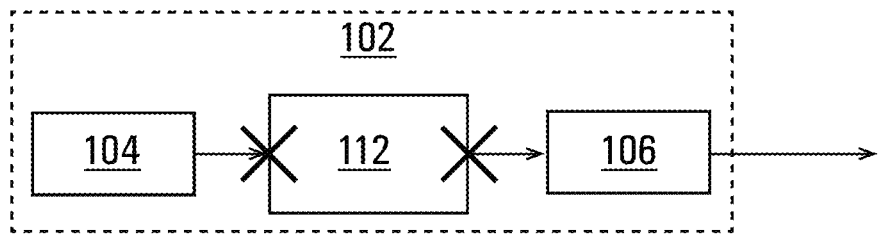
FIG. 1B depicts a silicon photonic chip with a bonded isolator, according to the prior art.

Another conventional implementation involves bonding magneto-optical materials to the silicon photonics fabrication flow, as depicted in FIG. 1B. In FIG. 1B, the silicon photonic chip 102 comprises the laser 104 and the silicon photonic transmitter 106, and a bonded isolator 112 on the chip 102 between the laser 104 and transmitter 106. However, using the bonded isolator 112 as depicted in FIG. 1B typically results in high optical losses and requires extensive front-end and back-end process modifications, which translate to years of research and development. While circuit-based approaches using RF modulators have also been investigated, their use in practice remains questionable (e.g., due to long, high-speed modulation segments requiring RF drive signals, high-loss, etc.). Hence, approaches using magneto-optical materials or RF modulation elements do not present a low-cost and a readily usable solution for photonics products.

Figure 1C:
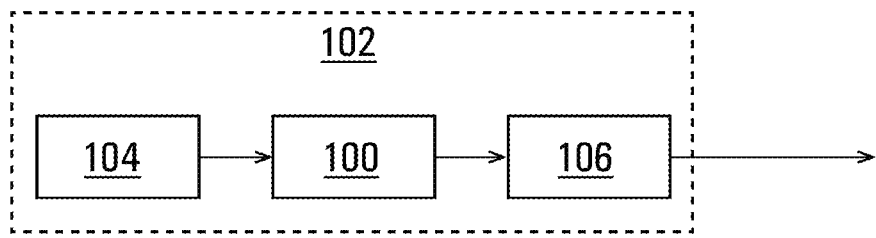
FIG. 1C depicts a silicon photonic chip with a reflection cancellation circuit, according to an example embodiment.

In contrast to the aforementioned conventional solutions, at least some example embodiments herein use an electronic-photonic integrated circuit-based method to control a reflection cancellation circuit ("RCC"), as depicted in FIG. 1C. In FIG. 1C, the silicon photonic chip 102 comprises the laser 104, the silicon photonic transmitter 106, and an RCC 100 connected therebetween. The RCC 100 dynamically cancels light reflected back into the laser's 104 cavity. As discussed further below, this is achieved using an electronic-controlled optical circuit that taps a portion of the laser's 104 output and feeds it back into the laser 104 with a phase adjustment such that it destructively interferes with unwanted parasitic back reflections.

Various example embodiments of the RCC 100 are described below in the context of a silicon photonics platform. However, in general, reflection cancellation may also be implemented on other integrated planar photonics platforms. The various example embodiments may be realized using commonly available components such as waveguides, couplers, phase shifters, and photodetectors ("PDs"). Example PDs comprise photodiodes and defect mediated detectors.

Figure 2:
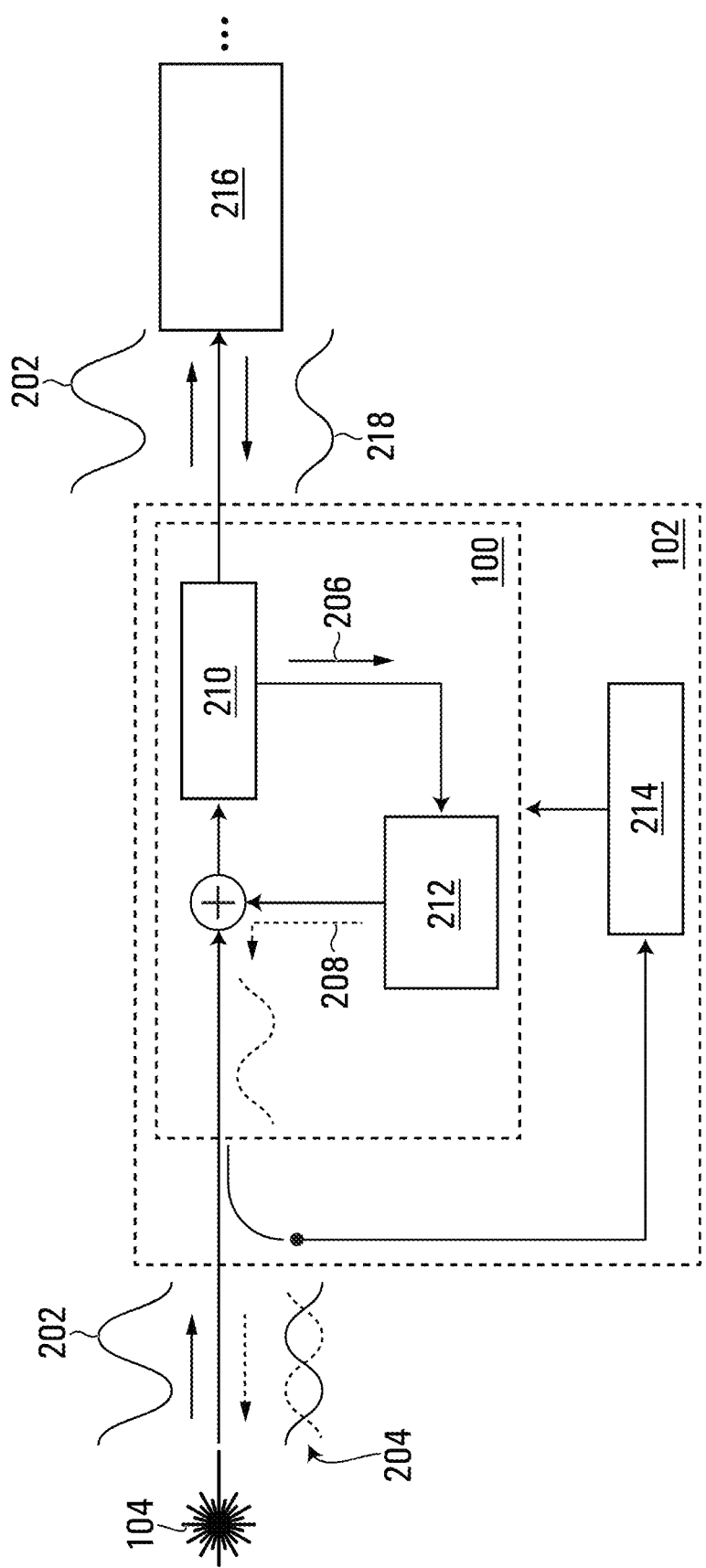
FIG. 2 depicts a system comprising the reflection cancellation circuit, according to an example embodiment.

Referring now to FIG. 2, there is depicted a block diagram of one example embodiment of the RCC 100. Signal flow directions in FIG. 2 are indicated using arrows. The RCC 100 is shown in conjunction with the laser 104 that feeds laser output 202 to the RCC's 100 input, and a device 216 such as a modulator that receives the laser output 202 from the RCC's 100 output. The laser output 202 reflects off the device 216, resulting in a parasitic reflection 218 being directed back towards the laser 104. The device 216 accordingly acts as a source of the parasitic reflection 218; in different example embodiments, and as alluded to above, integrated components may additionally or alternatively act as reflection sources as well.

The RCC 100 comprises a tunable tap 210 that taps a precise amount of the laser output 202, which is used to cancel at least some of the parasitic reflection 218 as discussed further below. The signal generated by tapping the laser output 202 using the tunable tap 210 is hereinafter interchangeably referred to as the "tapped signal" 206. The tapped signal 206 is directed to a phase shifter 212, which adjusts the phase of the tapped signal 206 so that it is out-of-phase with the parasitic reflection 218. The tapped signal 206 after its phase has been shifted by the phase shifter 212 is hereinafter interchangeably referred to as the "feedback signal" 208.

The feedback signal 208 is directed back towards the laser and summed with the parasitic reflections 218 such that the two signals 208,218 are superpositioned to result in a resulting signal 204. By virtue of the two signals 208,218 being out-of-phase and the percentage of the laser output 202 that the tunable tap 210 taps, the resulting signal 204 has a lower magnitude than the parasitic reflection 218 would otherwise have entering the laser 104. In at least some example embodiments, at least partially cancelling the parasitic reflection 218 in this way allows a system to omit a traditional optical isolator. An example magnitude of cancellation is 40 dB, comparing the resulting signal 204 to the feedback signal 208; the magnitude of cancellation may differ in other example embodiments.

As discussed further below, a control circuit 214 comprising part of the silicon photonic chip 102 is communicatively coupled to monitor the magnitude of the resulting signal 204 and to automatically adjust the magnitude and/or phase of the feedback signal 208 to better destructively interfere with the parasitic reflection 218. The control circuit 214 may comprise any suitable type of circuit (e.g., a controller) configured to perform a method such as that described in FIG. 11 below. In at least some example embodiments, the presented control method can be used to stabilize the laser 104 and introduce the correct amount of feedback such that the linewidth is reduced relative to normal operation for better operation.

Figure 3A:
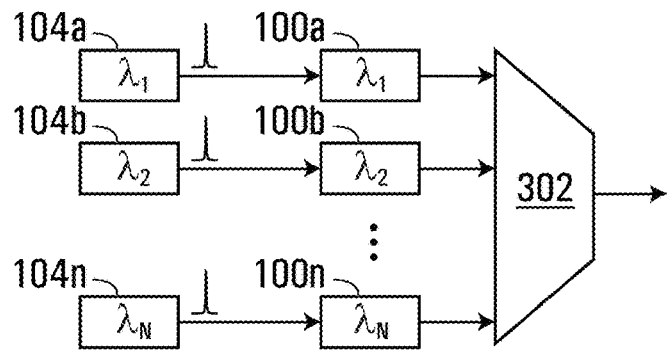
FIGS. 3A-3D depicts a system comprising multiple reflection cancellation circuits being used to cancel reflections of lasers emitting different wavelengths of light, according to example embodiments.
Figure 3B:
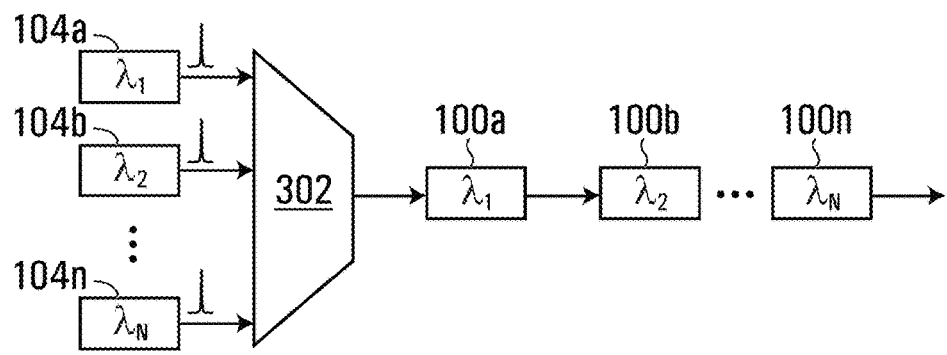
Figure 3C:
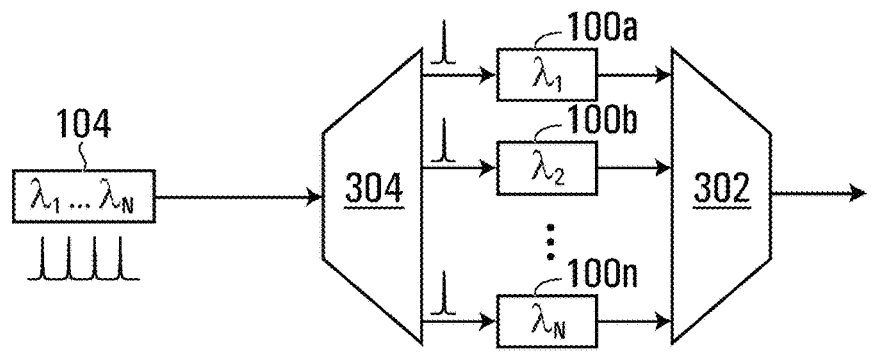
Figure 3D:
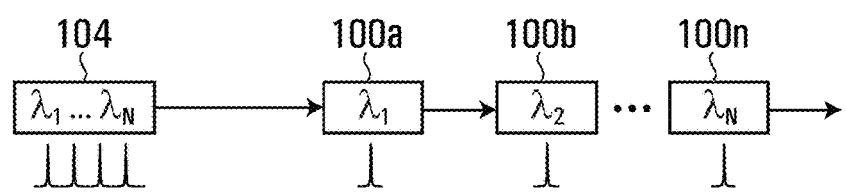

Referring now to FIGS. 3A-3D, there are shown various example embodiments in which multiple RCCs 100 are used to cancel reflections of lasers 104 emitting the laser output 202 at different wavelengths ($\lambda_1, \lambda_2 \ldots \lambda_N$) of light. A reference herein to the laser output 202 being at a particular wavelength means that the laser's 104 carrier is at that wavelength. FIGS. 3A and 3B show example embodiments in which RCCs 100 are used to cancel reflections in multiple single-wavelength lasers 104, while FIGS. 3C and 3D show examples in which RCCs 100 are used to cancel reflections into a single multi-wavelength laser 104.

FIG. 3A depicts using multiple RCCs 100a . . . n in parallel. In FIG. 3A, a first laser 104a emits light at a first wavelength $\lambda_1$, a second laser 104b emits light at a second wavelength $\lambda_2$, and additional lasers 104 emit light at various different wavelengths up to an $N^{th}$ laser 104n that emits light at an $N^{th}$ wavelength $\lambda_N$. The first through $N^{th}$ lasers 104a . . . n are respectively optically coupled in series with first through $N^{th}$ RCCs 100a . . . n, which in turn are respectively optically coupled to N inputs of a multiplexer 302. A signal at a selection input (not shown) of the multiplexer 302 may be used to select any one of the outputs of the RCCs 100a . . . n to be output from the multiplexer 302. Each of the RCCs 100a . . . n is accordingly responsible for cancelling reflections of a particular wavelength.

FIG. 3B depicts using multiple RCCs 100a . . . n in series. As in FIG. 3A, the first laser 104a emits light at a first wavelength $\lambda_1$, the second laser 104b emits light at a second wavelength $\lambda_2$, and additional lasers 104 emit light at various different wavelengths up to the $N^{th}$ laser 104n that emits light at an $N^{th}$ wavelength $\lambda_N$. The outputs of the lasers 104a . . . n are respectively optically coupled to the N inputs of the multiplexer 302. A signal at the selection input (not shown) of the multiplexer 302 may be used to select any one of the wavelengths of light, which is output to the first through Nth RCCs 100a . . . n. The first through Nth RCCs 100a . . . n are optically coupled in series to the multiplexer's 302 output. The RCC 100a . . . n that corresponds to the wavelength that the multiplexer 302 outputs uses its tunable tap 210 and phase shifter 212 to generate the feedback signal 208, thereby at least partially cancelling reflections. The remaining RCCs 100a . . . n do not tap any energy from the laser 104a . . . n, and thereby act as passive optical waveguides. In FIG. 3B, the RCCs 100a . . . n are wavelength-selective, thereby only tapping substantial power at the wavelength of the laser output 202 to which the RCCs 100a . . . n are tuned (i.e., the RCCs 100a . . . n are tuned to only tap substantial power at wavelengths $\lambda_{1 \ldots N}$, respectively).

FIG. 3C depicts using multiple RCCs 100a . . . n in parallel with a demultiplexer 304 and the multiplexer 302. A multi-wavelength laser 104 concurrently outputs light at wavelengths $\lambda_{1 \ldots N}$. The laser's 104 output is optically coupled to an input of the demultiplexer 304, which performs wavelength demultiplexing to separate the signals into wavelengths $\lambda_{1 \ldots N}$ that are respectively optically coupled into inputs of the RCCs 100a . . . n. The RCCs 100a . . . n are respectively configured to cancel reflections at wavelengths $\lambda_{1 \ldots N}$, and their outputs are optically coupled to the multiplexer's 302 inputs. A signal at the selection input (not shown) of the multiplexer 302 may be used to select any one of the wavelengths of light as in FIG. 3A.

FIG. 3D depicts using multiple RCCs 100a . . . n in series with the multi-wavelength laser 104 concurrently outputting multiple wavelengths $\lambda_{1 \ldots N}$ of light. Each of the RCCs 100a . . . n uses its tunable tap 210 and phase shifter 212 to generate the feedback signal 208 for a particular wavelength $\lambda_{1 \ldots N}$, thereby at least partially cancelling reflections for that wavelength. In FIG. 3D, the RCCs 100a . . . n are wavelength-selective, thereby only tapping substantial power at the wavelength of the laser output 202 to which the RCCs 100a . . . n are tuned (i.e., the RCCs 100a . . . n are tuned to only tap substantial power at wavelengths $\lambda_{1 \ldots N}$ respectively).

Figure 4:
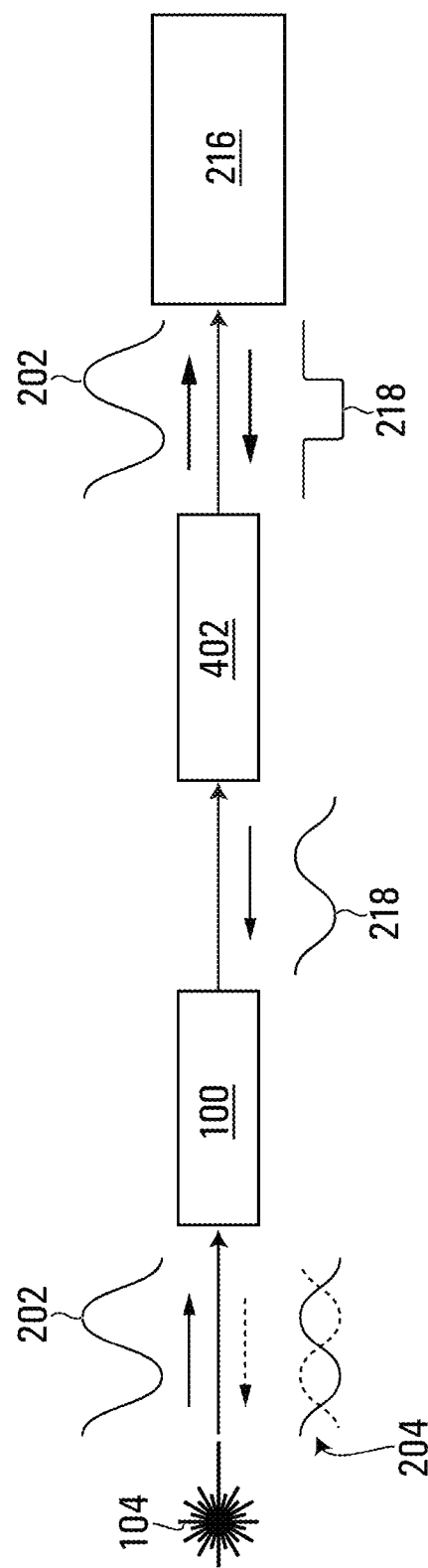
FIG. 4 depicts a system comprising the reflection cancellation circuit optically coupled to a high-Q filter, according to an example embodiment.

Referring now to FIG. 4, there is depicted an example system in which a high-Q filter 402 tuned to have a center wavelength corresponding to the laser output's 202 wavelength is optically coupled in series between the RCC's 100 output and the device's 216 input. As above, the laser 104 sends the laser output 202 to the RCC's 100 input. The RCC 100 is configured to only cancel the spectral component of a reflected signal at the laser output's 202 wavelength. However, when the unwanted reflections are due to a device such as a modulator or a switch, these reflections may contain additional spectral components. The effect of these spectral components is mitigated in FIG. 4 using the high-Q filter 402, which permits the laser output 202 to propagate to the device 216 and substantially filters out frequencies other than the laser output's 202 wavelength from the parasitic reflection 218. This is evidenced by the change in waveform shape of the parasitic reflection 218 as it passes through the high-Q filter 402 from the device 216 and towards the RCC 100; in FIG. 4, for the sake of illustration only, the parasitic reflection 218 prior to passing through the high-Q filter 402 is depicted as a pulse representing many superpositioned sinusoids, and is depicted as a single sinusoid after being filtered. On a planar integrated photonics platform, the high-Q filter 402 may comprise a Bragg-grating, microring, or a microdisk resonator. When used in conjunction with a wavelength-division multiplexing system, the high-Q filter 402 also filters wavelengths of laser output 202 from other lasers 104 (not shown in FIG. 4) that differ from the high-Q filter's 402 center wavelength. In at least some example embodiments, when non-carrier light intensity is sufficiently weak, the high-Q filter 402 is omitted as the laser 104 itself acts as a filter. Example quality factors may comprise those corresponding to a filter that has a bandwidth of less than twice the sub-carrier or modulation frequency of the laser output 202, which is applied to the laser 104 via an external modulator or direct modulation. For example, if the laser output 202 has a modulation frequency of 10 GHz, a "high-Q" filter may have a center wavelength corresponding to the 10 GHz frequency at the laser's 104 carrier frequency and have a total bandwidth of less than 20 GHz; this permits the carrier to be transmitted to the device 216, and blocks sidebands on the way back to the laser 104.

Figure 5:
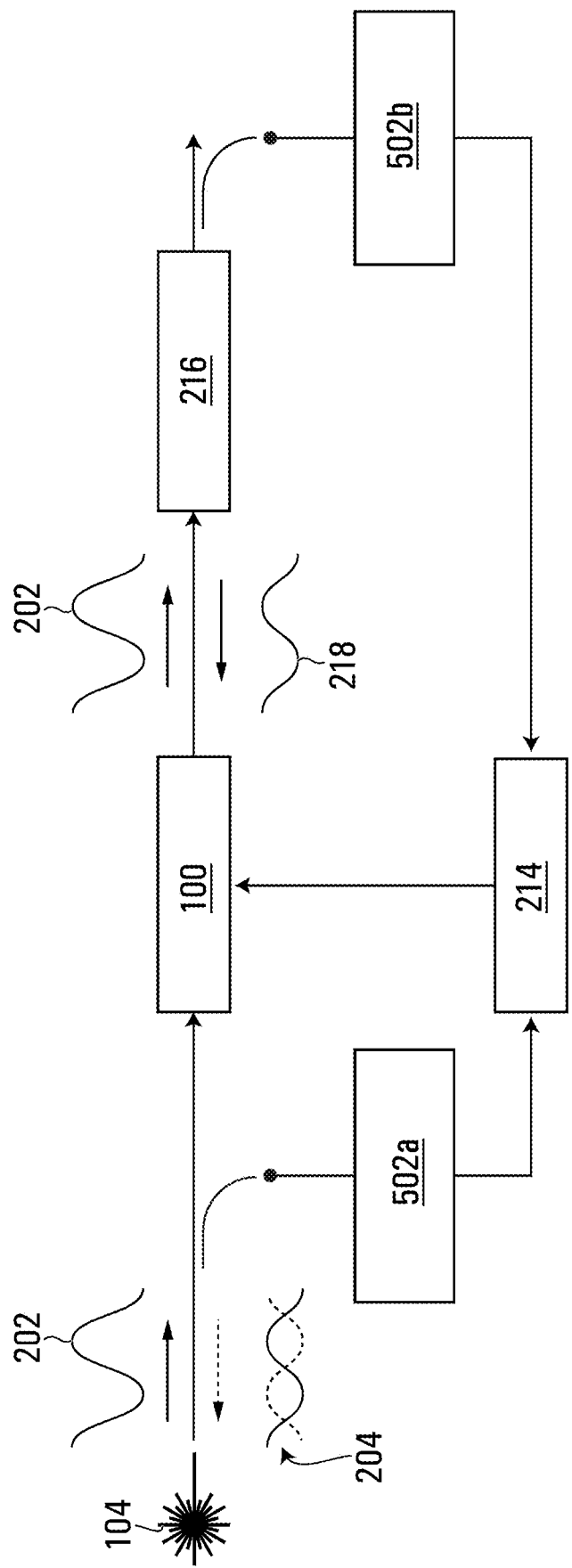
FIG. 5 depicts a system comprising the reflection cancellation circuit and monitor circuits, according to an example embodiment.

FIG. 5 depicts a system analogous to that depicted in FIG. 2, with the addition of first and second monitor circuits 502a,b that can be used to assess the laser's 104 performance and control the RCC 100 (which may also include the high-Q filter 402 of FIG. 4) accordingly. In FIG. 5, the first monitor circuit 502a monitors the laser output 202 as it propagates from the laser 104 to the RCC 100, while the second monitor circuit 502b monitors the output of the device 216. Both of the monitor circuits 502a,b are communicatively coupled to the control circuit 214. In at least some different example embodiments, there may be more or fewer than two monitor circuits 502a,b, and they may be optically coupled to the system to monitor different portions of the system than shown in FIG. 5 depending on the particular parameters being monitored.

The monitor circuits 502a,b may be configured to evaluate laser parameters such as side mode suppression ratio ("SMSR"), relative intensity noise ("RIN"), linewidth, and self-pulsations. The monitor circuits 502a,b may comprise a high-Q filter such as a Bragg-grating, microring, or a microdisk resonator, configured to suppress the laser carrier and pass non-carrier light to a photodetector, which measures the power of the out-of-band signal to determine laser stability. Poor stability may be indicative of the RCC 100 not sufficiently cancelling the parasitic reflection 218, and be cause for the control circuit 214 to adjust the magnitude and/or phase of the feedback signal 208 in an attempt to reduce the resulting signal's 204 magnitude.

Figure 6A:
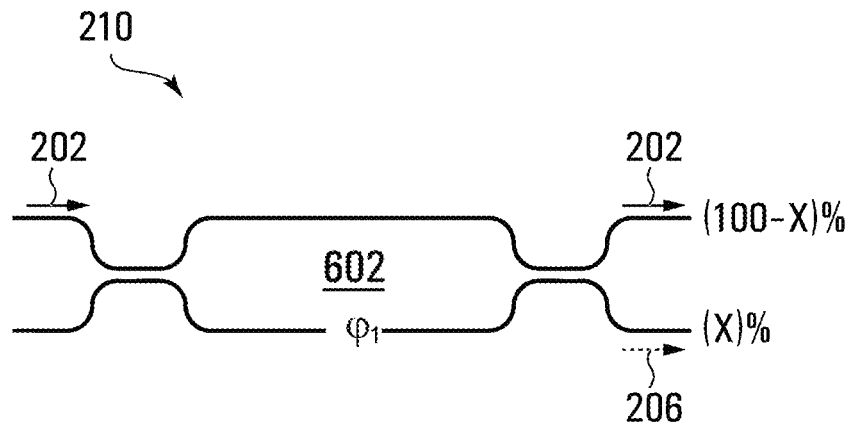
FIGS. 6A and 6B depict two example embodiments of a tunable tap that comprises part of the reflection cancellation circuit.
Figure 6B:
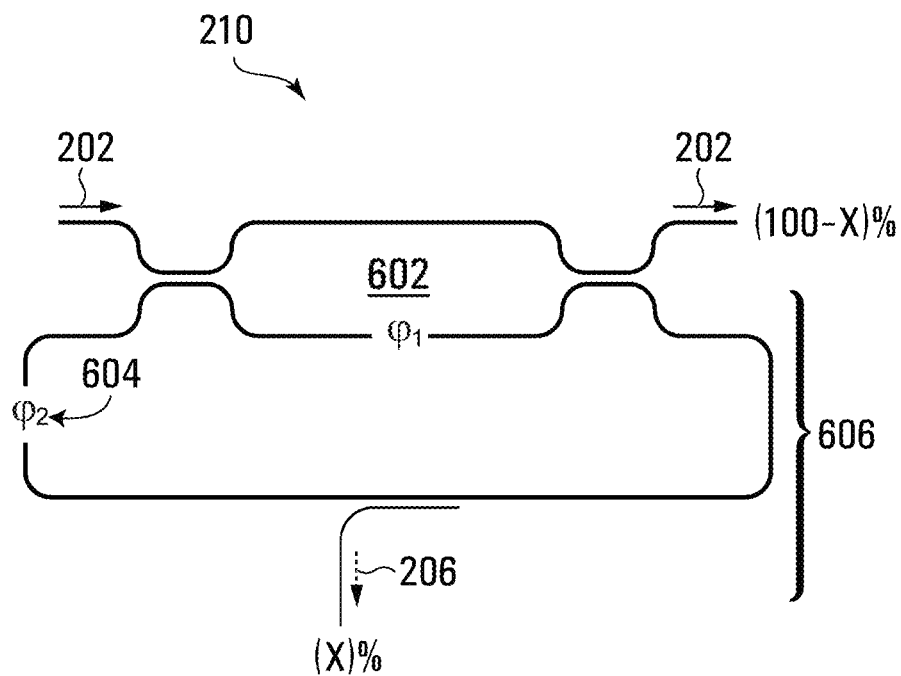

Referring now to FIGS. 6A and 6B, there are shown two example embodiments of the tunable tap 210. In FIG. 6A, the tunable tap 210 comprises a Mach-Zehnder interferometer ("MZI") 602. The MZI 602 comprises two arms, with a phase shifter positioned along at least one of the arms, which can introduce a phase shift ($\varphi_1$) in one of the arms relative to the other. The laser output 202 entering the MZI 602 is split into the MZI's 602 two arms using 3-dB couplers: 50% goes to the MZI's 602 top arm and 50% goes to the MZI's 602 bottom arm. Similarly, the directional couplers forming the MZI are 3-dB. The laser output 202 is output using a first output at an end of one of the arms, and is (100−X) % of the intensity of the laser output 202 that is the input to the MZI 602. The tapped signal 206 is output using a second output at an end of the other of the arms, and is X % of the intensity of the laser output 202 that is the input to the MZI 602. The value of "X", which represents the intensity of the tapped signal 206, is controlled using the phase shifter in either of the MZI's arms.

In FIG. 6B, the tunable tap 210 comprises a ring resonator 608, with the percentage of the laser output 202 diverted to the ring resonator 606 being controlled by an MZI 602. The laser output 202 is the input to the MZI 602, and (100−X) % of the laser output 202 is output from the arm of the MZI 602 that does not feed the ring resonator 606. A ring resonator phase shifter 604 controls the resonance wavelength of the ring and is shown as introducing a phase shift $\varphi_2$, where $\varphi_2$ may differ from $\varphi_1$ of the MZI 602). The tunable tap 210 of FIG. 6B may be used to tap a particular wavelength by setting the resonance wavelength of the ring to the wavelength of interest, as discussed in further detail in respect of certain example embodiments below.

Figure 7:
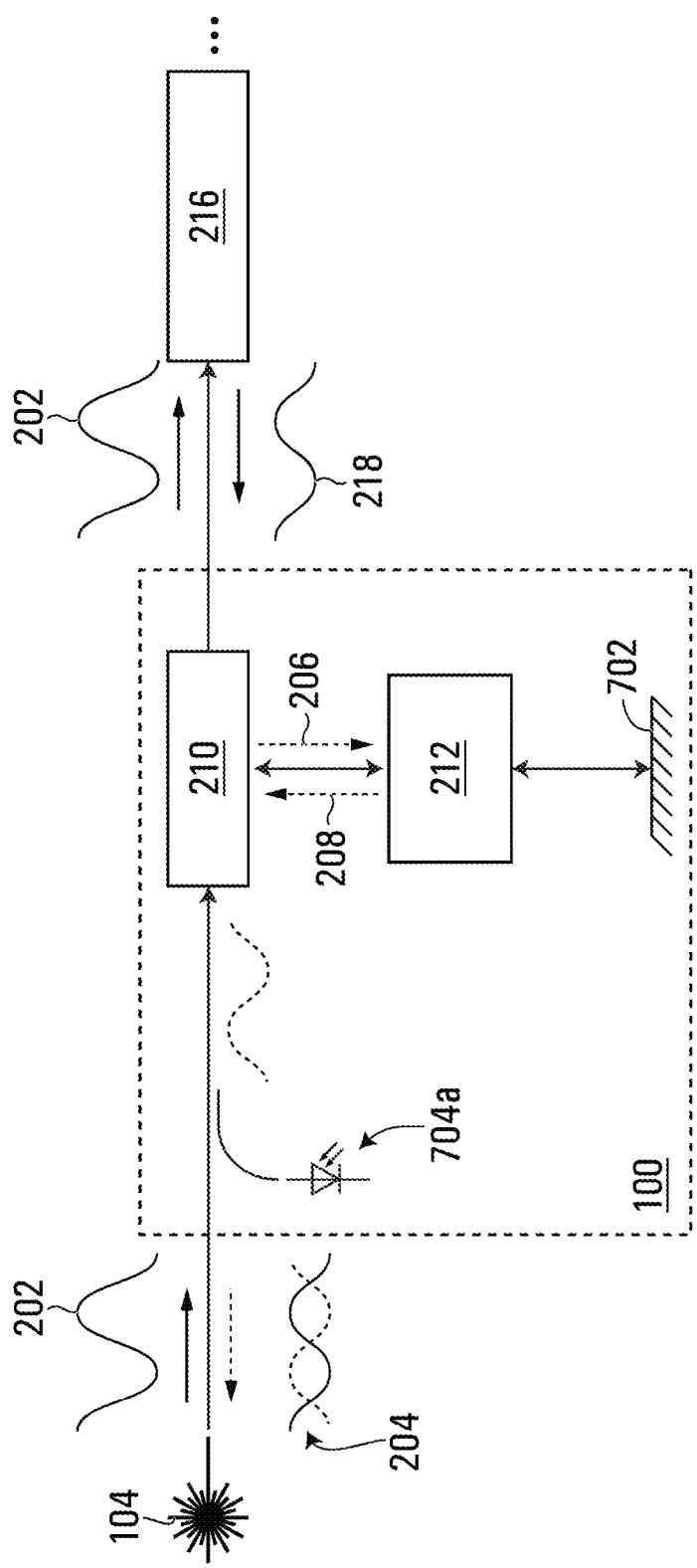
FIGS. 7-9 depict systems comprising the reflection cancellation circuit, according to additional example embodiments.

FIG. 7 shows another embodiment of a system comprising the RCC 100. As in FIG. 2, the system of FIG. 7 comprises the laser 104, the tunable tap 210, the phase shifter 212, and the device 216. Also as in FIG. 2, the laser output 202 propagates from the laser 104 to the device 216, which returns the parasitic reflection 218; the tunable tap 206 taps the laser output 202 to generate the tapped signal 206; and the tapped signal 206 is phase shifted by the phase shifter 212 to create the feedback signal 208, which is superpositioned on the parasitic reflection 218 to result in the resulting signal 204. In contrast to FIG. 2, in FIG. 7 the system further comprises a means for reflecting light in the form of a mirror 702 optically coupled downstream of the phase shifter 212 so that the tapped signal 206, once phase shifted by the phase shifter 212, reflects off the mirror 702 and back towards the laser 104. The system of FIG. 7 also comprises a first photodetector 704a optically coupled between the laser 104 and the tunable tap 210 to monitor the magnitude of the resulting signal 204. The first photodetector 704a uses a tap of the resulting signal 204 when monitoring.

Referring to FIG. 7 and other embodiments, the taps that tap a signal to the photodetector or photodetectors can be fixed to any value between 0% and 100% (e.g. 5%) or even be a variable tap using the embodiment in FIG. 6A. If a tunable tap is used (similar to the embodiment in FIG. 6A), a tap can be adjusted based on the photodetector specifications, post-fabrication, sufficient for a high signal to noise ratio. For example, if the photodetectors have a large noise equivalent power, or if the reflections going back to the laser are very small in magnitude, any one or more of the photodetectors' power taps can be increased to read a high photocurrent to photodetector noise ratio signal. If the photodetectors have a very small noise equivalent power, or if the reflections going back to the laser are large, any one or more of the photodetectors' power taps can be reduced to minimize the optical losses due to the optical power tapped to the photodetectors, and thus reduce the overall optical losses of the reflection-cancellation circuit. If $K^2$ is the photodetector's power coupling ratio, $K^2$ in at least some embodiments is set such that the minimum power going back to the laser ($P_{min}$) is the required feedback for a stable laser operation. The relationship between $P_{min}$ and $K^2$ is given by the following expression, $$P_{min} = NEP \frac{1 - \kappa^2}{\kappa^2}$$

where NEP is the photodetector noise-equivalent power.

In FIG. 7, the control circuit 214 (not shown in FIG. 7) may automatically condition the resulting signal 204 using a conditioning method such as minimum seeking method based on Ipm, which is the photocurrent measured by the first photodetector 704a. The minimum seeking method steps the power supplied to the tunable tap 210 and to the phase shifter 212 in the direction that minimizes $I_{PD1}$. For example, the control circuit 214 may adjust the amount of energy tapped by the tunable tap 210 while holding phase shift constant until $I_{PD1}$ is at a minimum with respect to the amount of power tapped by the tunable tap 210, then adjust the amount the phase of the tapped signal 206 is shifted by the phase shifter 212 while holding tapped power constant until $I_{PD1}$ is at a minimum with respect to the phase shift introduced by the phase shifter 212. In at least some example embodiments, the control circuit 214 iteratively repeats these two actions until $I_{PD1}$ can be no longer reduced. Additionally, in at least some example embodiments, $I_{PD1}$ is reduced using the aforementioned method, although not to its theoretically minimum value.

Figure 8:
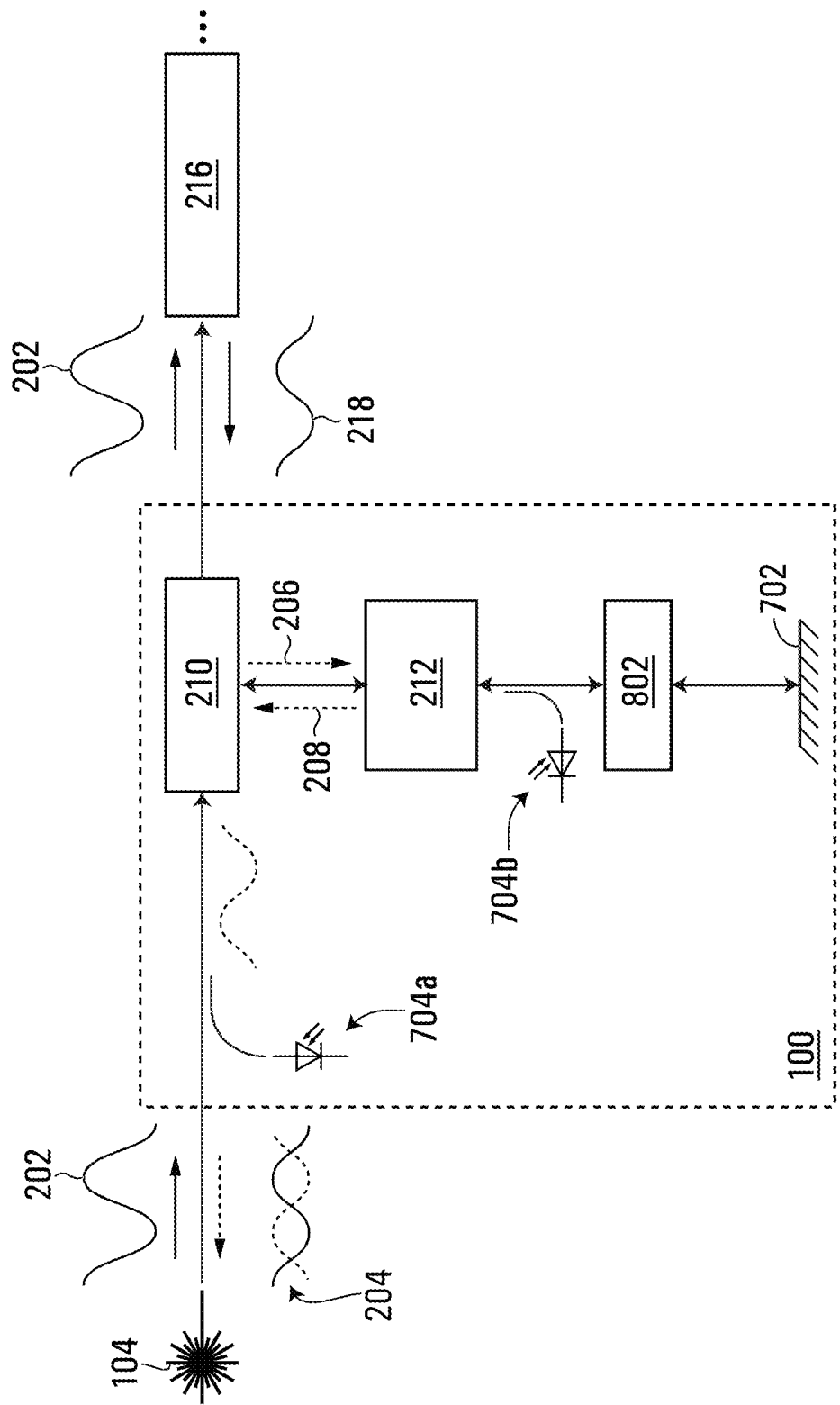

Referring now to FIG. 8, there is shown another example embodiment of the system comprising the RCC 100. The system of FIG. 8 is analogous to that of FIG. 7, except the RCC 100 in FIG. 8 further comprises a variable optical attenuator ("VOA") 802 optically coupled between the phase shifter 212 and the mirror 702, and a second photodetector 704b optically coupled between the phase shifter 212 and the VOA 802 to monitor the magnitude of the feedback signal 208. The VOA 802 provides a means for turning off the feedback signal 208 during a conditioning period. Adding the second photodetector 704b and the VOA 802 can help reduce the initial conditioning time required to condition the feedback signal 208 by simplifying the conditioning method.

In at least some example embodiments, both the photocurrents generated using the first and second photodetectors 702a,b ($I_{PD1}$ and $I_{PD2}$, respectively) are used to generate the control signals sent by the control circuit 214 (not shown in FIG. 8) to automatically condition the feedback signal 208. First, the VOA 802 is turned on and its attenuation is set to a maximum attenuation value; this prevents any excessive feedback into the laser due to the RCC 100. The magnitude of the parasitic reflection 218 is then measured by recording $I_{PD1}$. The control circuit 214 then adjusts the tunable tap such that the portion of tapped light, which corresponds to the magnitude of the feedback signal 208 and measured by reading $I_{PD2}$, is equal in magnitude to that of the parasitic reflection 218 measured using bpi. The control circuit 214 then gradually reduces the attenuation caused by the VOA 802 while tuning the phase shifter 212 to minimize $I_{PD1}$. Once maximum cancellation is initially achieved using this conditioning method, the control circuit 214 may apply the minimum seeking method as described above in respect of FIG. 7 to adjust amplitude and/or phase of the feedback signal 208 to account for any real-time changes in the parasitic reflection 218.

Figure 9:
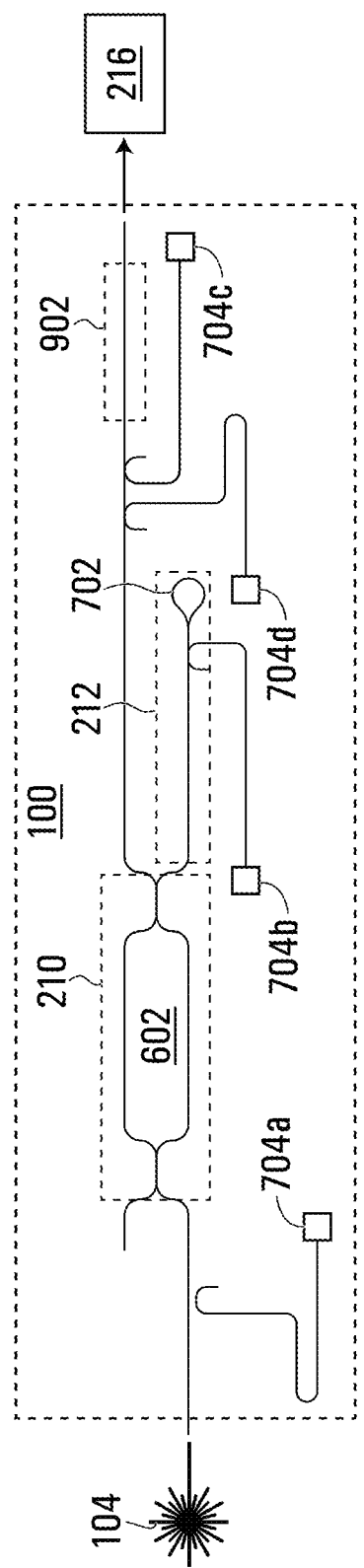

Referring now to FIG. 9, there is shown an example embodiment of a system comprising the RCC 100 that is configured to perform, in conjunction with the control circuit 214 (not shown in FIG. 9), real-time reflection cancellation by applying a single-dimension sweep conditioning method based on readings from first through fourth photodetectors 704a-d. The RCC 100 in FIG. 9 uses the MZI 602 to implement the tunable tap 210, as described above in respect of FIG. 6A. In FIG. 9, the laser 104 is optically coupled to one arm of the MZI 602 as the MZI's 602 input. The MZI 602 has two output arms, of which one outputs the laser output 202 at intensity (100–X) % of the MZI's 602 input, and the other outputs the tapped signal 206 at intensity X % of the MZI's 602 input. As in FIG. 7, the tapped signal 206 is optically coupled to the phase shifter 212 and to the mirror 702; in FIG. 7, the phase shifter 212 may be thermally controlled. The RCC 100 also comprises an integrated optical attenuator 902 optically coupled to the MZI's 602 output to receive the laser output 202. The device 216 may be optically coupled to the RCC 100 to receive the laser output 202 via the optical attenuator 902. The optical attenuator 902 uses a p-i-n junction for calibrating the RCC 100. When forward biased, the free-carrier absorption of the attenuator 902 increases thus increasing optical power losses, which suppresses the power going into the device 216 as well as the parasitic reflection 218. The optical attenuator 902 can also use a tunable MZI such that when the MZI is biased, light is routed to a different port instead of going to the device. In FIG. 9 the photodetector power taps are shown as fixed taps to indicate the direction of light that is to be detected using the photodetectors. Such power taps can be fixed, or tunable using for example an MZI, as discussed above.

The first photodetector 704a is optically coupled between the laser 104 and the tunable tap 210 to monitor magnitude of the resulting signal 204; the second photodetector 704b is optically coupled between the phase shifter 212 and the mirror 702 to monitor the magnitude of the feedback signal 208; the third photodetector 704c is optically coupled between the tunable tap 210 and the optical attenuator 902 to monitor the magnitude of the parasitic reflection 218; and the fourth photodetector 704d is optically coupled between the tunable tap 210 and the optical attenuator 902 to monitor the magnitude of the laser output 202 as emitted by the tunable tap 210 (i.e., at 100−X % of the magnitude of the laser output 202 that is input to the tunable tap 210, where X represents the magnitude of the tapped signal 206).

Figure 10A:
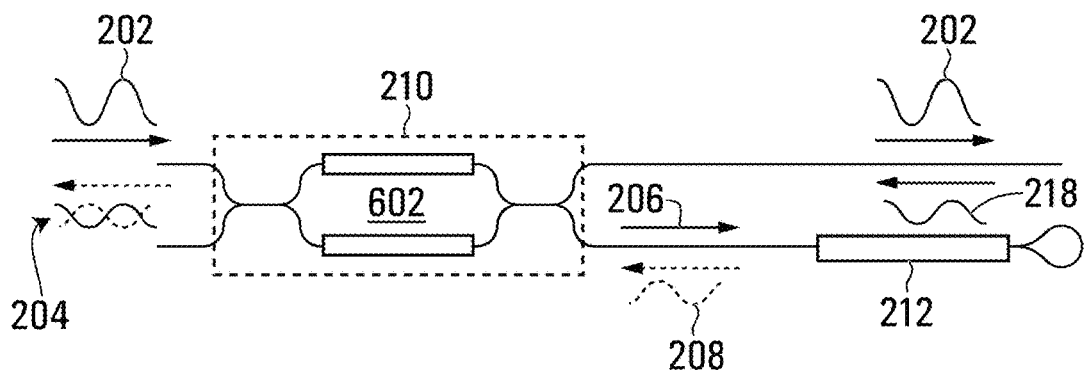
FIG. 10A depicts the reflection cancellation circuit of FIG. 9 as a Michelson interferometer.

FIG. 10A represents the RCC 100 of FIG. 9 as a Michelson interferometer ("MI"), with the tunable tap 210, implemented using the MZI 602, controlling the power going into each arm of the MI. The device 216 is to be connected to the arm of the MI that receives the laser output 202, and the feedback circuit comprising the phase shifter 212 and mirror 702 is on the other arm of the MI.

Figure 10B:
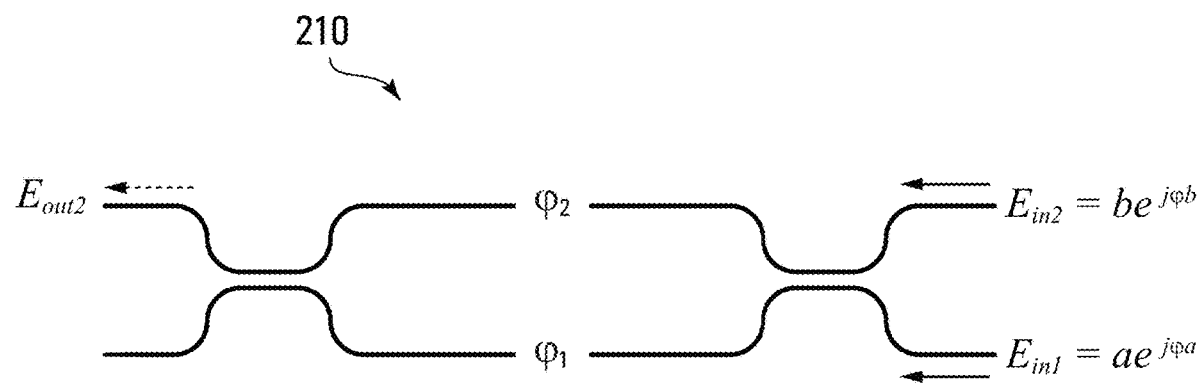
FIG. 10B depicts a Mach-Zehnder interferometer comprising part of the reflection cancellation circuit of FIG. 10A.

FIG. 10B depicts the MZI 602 in detail. The following describes example conditions that result in the parasitic reflection 218 being cancelled. FIG. 10B depicts two signals being directed upstream through the MZI's 602 bottom and top arms, respectively: $E_{in1}$ (the feedback signal 208) and $E_{in2}$ (the parasitic reflection 218). Assuming a 50% power coupling ratio at each of the directional couplers ("DCs"), $E_{out2}$ (the resulting signal 204) in FIG. 10 is $$E_{out2} = ae^{j\left(\phi_a + \frac{\phi_1+\phi_2-\pi}{2}\right)}\cos\left(\frac{\Delta\phi}{2}\right) + be^{j\left(\phi_b + \frac{\phi_1+\phi_2-\pi}{2}\right)}\sin\left(\frac{\Delta\phi}{2}\right), \quad (1)$$

where $\Delta\phi = \phi_2 - \phi_1$, $\phi_1$ and $\phi_2$ are the phases of the bottom and top arms of the MZI 602 respectively, and $\phi_a$ and $\phi_b$ are the phases of the feedback signal 208 and parasitic reflection 218 going to the tunable tap 210, respectively. Setting $E_{out2}=0$, $$E_{out2} = ae^{j\left(\phi_a + \frac{\phi_1+\phi_2-\pi}{2}\right)}\cos\left(\frac{\Delta\phi}{2}\right) + be^{j\left(\phi_b + \frac{\phi_1+\phi_2-\pi}{2}\right)}\sin\left(\frac{\Delta\phi}{2}\right). \quad (2)$$

When Equation (2) is satisfied, the feedback signal 208 and parasitic reflection 218 interfere destructively at $E_{out2}$ such that no power goes back into the laser 104 (i.e., the magnitude of the resulting signal 204 is zero). Achieving this result imposes two requirements: magnitude and off-phase matching. To achieve magnitude matching, the magnitude of the parasitic reflection 218 and the feedback signal 208 should be equal in magnitude, where $$\cos\left(\frac{\Delta\phi}{2}\right) = b\sin\left(\frac{\Delta\phi}{2}\right). \quad (3)$$

To achieve off-phase matching, the parasitic reflection 218 and the feedback signal 208 should be set out-of-phase, where $$\phi_a = \phi_b + \pi(2m-1), \; m \in \mathbb{Z}^+, \quad (4)$$

The MZI 602 and the phase shifter 212 are used to satisfy the conditions of Equations (3) and (4). The control circuit 214 may satisfy the magnitude condition of Equation (3) by tuning the phase shifter on one or both of the arms of the MZI 602 (using one or both phase shifters results in a phase of $\phi_1$ to the bottom arm and $\phi_2$ to the top arm, as indicated in FIG. 10B). The control circuit 214 may satisfy the phase condition of Equation (4) by adjusting the phase shifter 212, which in FIG. 9 is a thermal phase shifter that changes $\phi_a$.

As shown in FIG. 9, four photodetectors 704a-d are used for the dynamic suppression of the parasitic reflection 218. The first photodetector 704a measures power going back into the laser 104; the conditions of Equations (3) and (4) are met when $I_{PD1}$ is minimized. One way to minimize $I_{PD1}$ is through a two-dimensional sweep over the phase shift introduced by the MZI 602 and the phase shifter 212. This is because any increase in the power going back to the laser 104 can result from a change in the magnitude or the phase of the parasitic reflection 218. This process can consume relatively high amounts of power and time. Accordingly, to avoid the two-dimensional sweep, the second through fourth photodetectors 704b-d are used: the second and fourth photodetectors 704b,d measure the through and cross power coupling ratios of the tunable tap 210, while the third photodetector 704c senses any changes in the magnitude of the parasitic reflection 218. In this configuration, the power tapped using the tunable tap 210 is adjusted based on the current measured using the second through fourth photodetectors 704b-d ($I_{PD2}$, $I_{PD3}$, and $I_{PD4}$), and only a one-dimensional sweep over the second photodetector 704b may be used to minimize $I_{PD1}$ and suppress the parasitic reflection 218 going into the laser 104.

Figure 11:
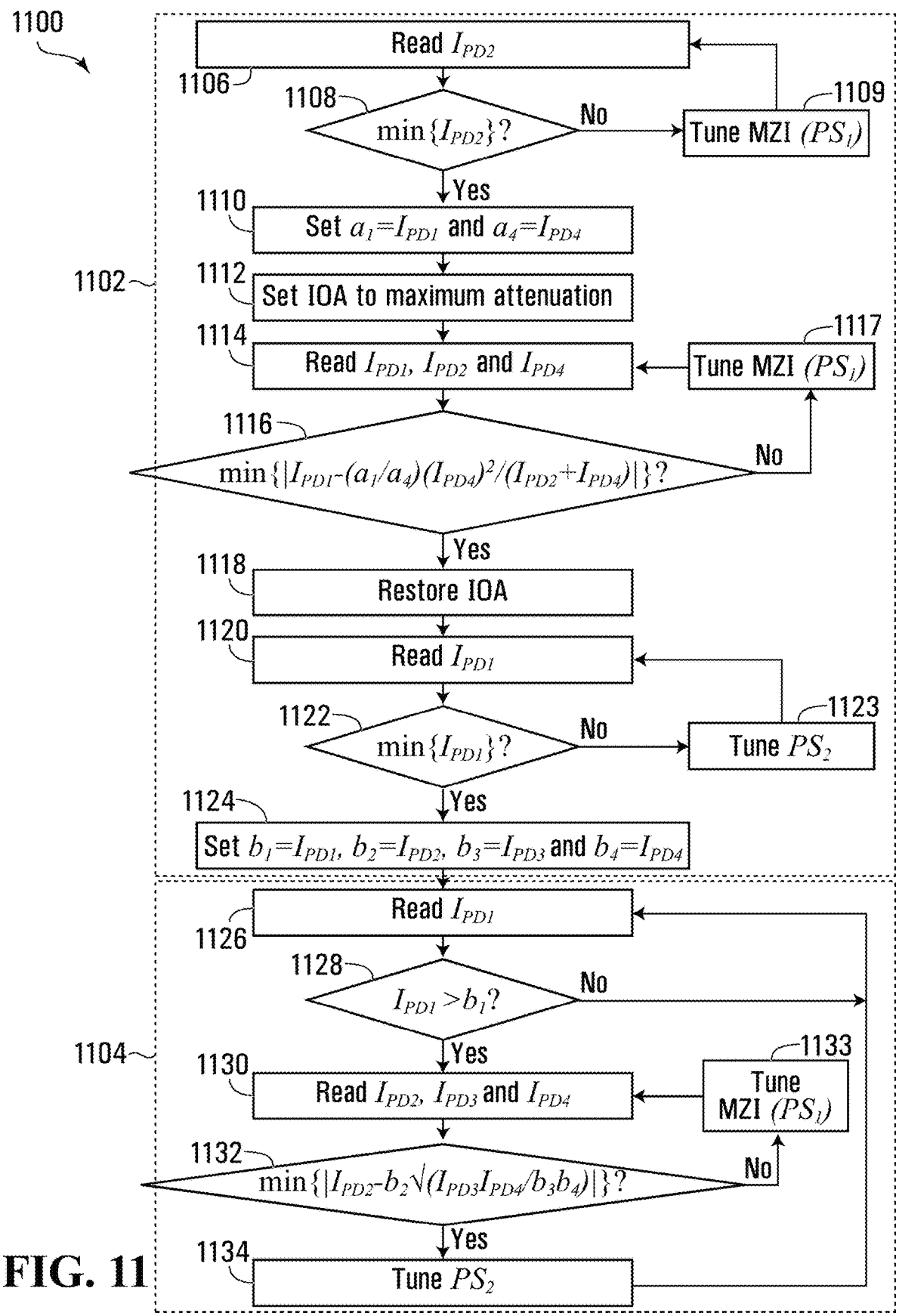
FIG. 11 depicts a method for calibrating the reflection cancellation circuit and dynamically cancelling reflections using the reflection cancellation circuit, according to an example embodiment.

Referring now to FIG. 11, there is depicted a method 1100 for achieving real-time cancellation of the parasitic reflection 218 based on currents $I_{PD1}$-$I_{PD4}$ using a single-dimension sweep optimization, according to an example embodiment. The method 1100 comprises a calibration phase 1102 (represented by blocks 1106-1124) applied to calibrate the RCC 100 and a dynamic cancellation phase 1104 (represented by blocks 1126-1134) applied to dynamically adjust the RCC 100 in response to changes in the magnitude and/or phase of the parasitic reflection 218. The method 1100 may be encoded as computer program code for execution by a processor, which may comprise part of the control circuit 214. When the processor executes the code, the control circuit 214 may cause the RCC 100 to perform the method 1100.

The control circuit 214 begins by tuning the tunable tap 210 (interchangeably referred to in FIG. 11 as the "MZI" and "PS1") to direct all the laser output 202 to the device 216 (blocks 1106, 1108, and 1109). The control circuit 214 determines when all the laser output 202 is being directed to the device 216 by minimizing $I_{PD2}$. When $I_{PD2}$ is minimized (block 1108), the control circuit 214 measures and saves Ian and $I_{PD4}$ as $a_1$ and $a_4$, respectively (block 1110).

The control circuit 214 then sets the optical attenuator 902 to maximum attenuation (block 1112) and tunes the tunable tap 210 until the magnitude of the tapped signal 206 (and consequently the feedback signal 208) is equal in magnitude to that of the parasitic reflection 218. The control circuit 214 determines when this condition is achieved by reading $I_{PD1}$, $I_{PD2}$, and $I_{PD4}$ and by adjusting the tunable tap 210 until the following is satisfied (blocks 1114, 1116, and 1117):

$$I_{PD_1} = \frac{a_1}{a_4} \frac{(I_{PD_4})^2}{I_{PD_2} + I_{PD_4}}. \quad (5)$$

Once this condition is satisfied, the control circuit 214 restores the attenuator (block 1118), which permits the parasitic reflection 218 to flow into the laser 104. The control circuit 214 then tunes the phase shifter 212 until $I_{PD1}$ is minimized (blocks 1120, 1122, and 1123). Once $I_{PD1}$ is minimized, the control circuit 214 measures and saves $I_{PD1}$, $I_{PD2}$, $I_{PD3}$, and $I_{PD4}$ as $b_1$, $b_2$, $b_3$, and $b_4$, respectively (block 1124).

If the parasitic reflection's 218 magnitude and/or phase change, then $I_{PD1}$ will exceed $b_1$. The dynamic cancellation phase 1104 adjusts the RCC's 100 configuration in response to any such changes in the parasitic reflection 218 to maintain a satisfactory level of destructive interference between the feedback signal 208 and the parasitic reflection 218 such that the magnitude of the resulting signal 204 is sufficiently low.

When the control circuit 214 determines that $I_{PD1}$ exceeds $b_1$ (blocks 1126 and 1128), the control circuit 214 first ensures the power of the parasitic reflection 218 and feedback signal 208 are equal by tuning the tunable tap 210 until the following is satisfied (blocks 1130, 1132, and 1133):

$$I_{PD_2} = b_2 \sqrt{\frac{I_{PD_3} I_{PD_4}}{b_3 b_4}}. \quad (6)$$

Once the condition as defined by Equation (6) is satisfied, the control circuit 214 adjusts the phase shifter 212 at block 1134 until $I_{PD1}$ is again no longer greater than $b_1$ (blocks 1126 and 1128). Thus, the method 1100 permits dynamic operation of the RCC 100 by performing two single-dimensional sweeps. While the phase of the feedback signal 208 is performed after that of the magnitude of the feedback signal 208 in FIG. 11, in at least some different example embodiments (not depicted) the phase sweep may be done before the magnitude sweep. For example, the phase and magnitude sweeps may be decoupled from each other by biasing the tunable tap 210 to quadrature and using a push-pull mechanism to tune the tunable tap 210 to avoid changing the feedback signal's 208 phase while tapping a certain amount of power.

Additionally or alternatively to the method 1100 of FIG. 11, and as alluded to above, the control circuit 214 may control the RCC 100 in ways different than as described in FIG. 11 in order to partially or entirely cancel the parasitic reflection 218. For example, the control circuit 214 may iteratively adjust the phases of the MZI 602 and the phase shifter 212 until the power read by the first photodetector 704a is reduced and, ideally, minimized. In at least some example embodiments, the control circuit 214 may apply the method 1100 of FIG. 11 in the form of a control loop, and the magnitude and/or phase of the parasitic reflection 218 may change more quickly than the control circuit 214 can update the control loop. In such an example, the control circuit 214 may alternatively apply the method 1100 of FIG. 11 to reduce and ideally minimize the power read by the first photodetector 704a by using two single-dimensional sweeps as opposed to, for example, a two-dimensional sweep over the MZI 602 and the phase shifter 212.

As another example, the control circuit 214 may perform sweeps of the phase and magnitude of the feedback signal 208 and measure performance metrics such as RIN and linewidth described above. The control circuit 214 may accordingly generate a feedback stability diagram of the laser 104 in the form of a 2D map plotting stability vs. settings for the tunable tap 210 and phase shifter 212. The control circuit 214 may use the 2D map to jump immediately to an operating region where the laser 104 is known to be stable, rather than by applying the calibration phase 1102, for example. Once the laser 104 is stable, the control circuit 214 may then apply the dynamic cancellation phase 1104 as described above to maintain stability in the presence of environmental fluctuations and feedback changes.

Referring now to FIG. 12, there is shown a graph of optical power losses at various device reflections. Optical power losses due to the RCC 100 at an arbitrary device reflection is given by the following:

$$\text{loss}=10[\log_{10}(10^{R_{dB}/10}-1)-\log_{10}(10^{R_{dB}/20}-1)], \quad (7)$$

where $R_{dB}$ is the power reflected in dB. The graph shows that optical loss is <0.5 dB for reflections<−20 dB. This optical loss is due to the tunable power tap that taps the optical power to the mirror. This loss excludes the losses due to the photodetectors' power taps.

Figure 12A:
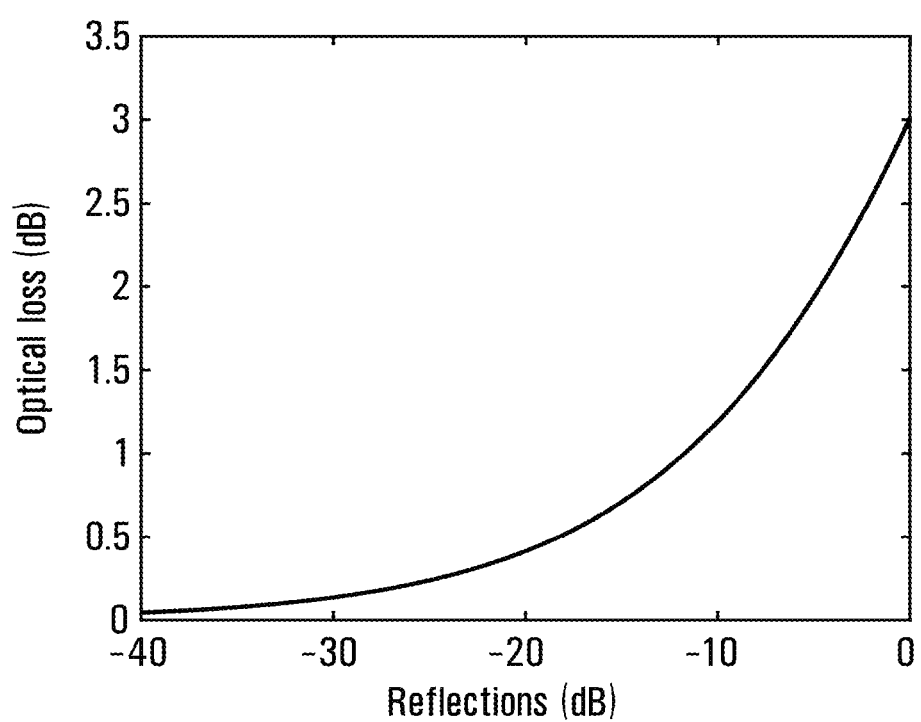
FIG. 12A depicts a graph of optical power losses due to the tunable power tap (excluding the photodetector power taps) for the reflection cancellation circuit at various device reflections, according to an example embodiment.
Figure 12B:
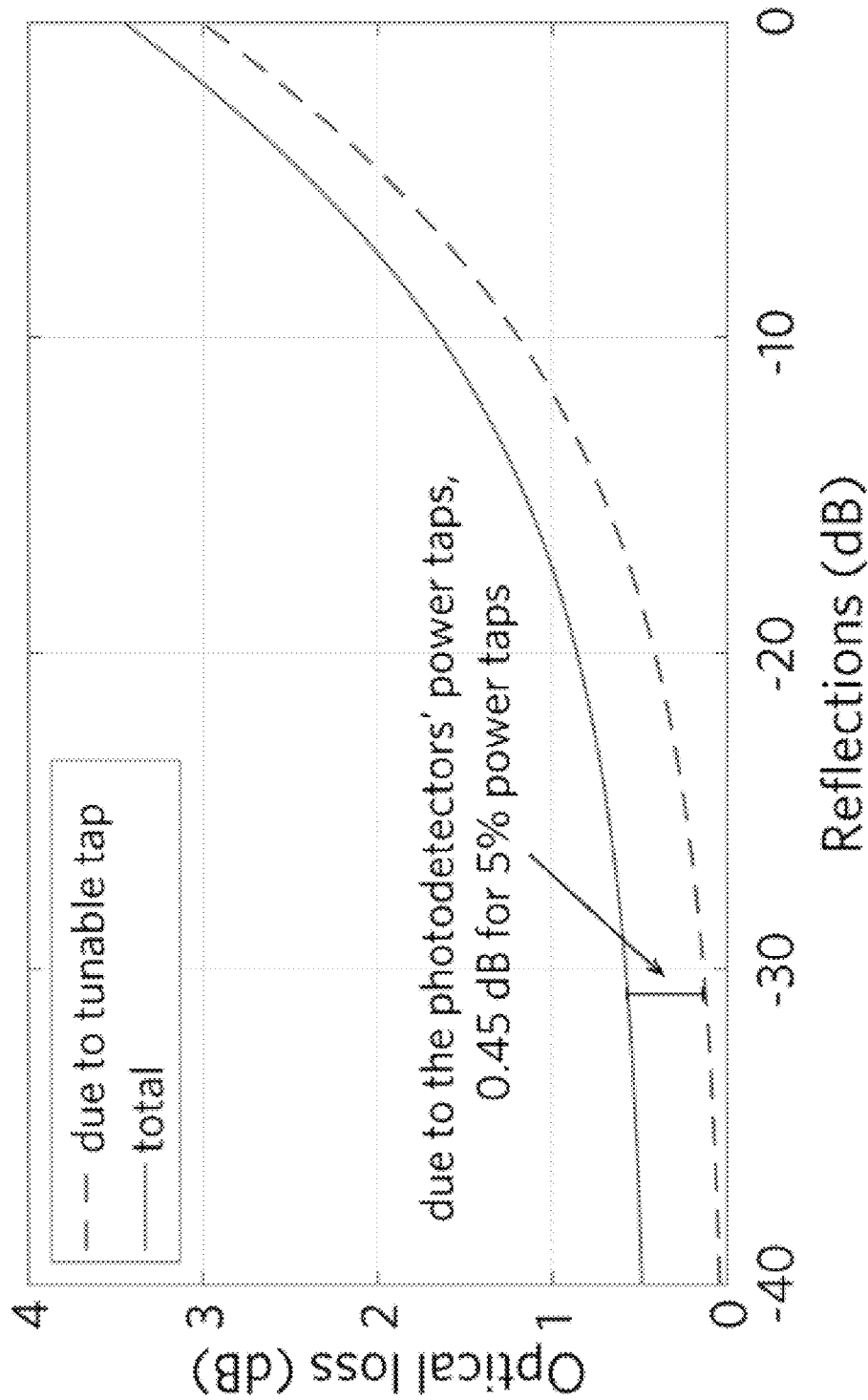
FIG. 12B depicts a graph of the total optical power loss, due to the tunable power tap as well as the photodetectors' power taps.

Referring to FIG. 12B, the total optical power loss, including the photodetectors' power taps, exceeds that shown in FIG. 12A. Using a fixed power tap results in a constant offset to the optical loss shown in FIG. 12B. In compliance with the embodiment in FIG. 9, the extra power loss in decibels due to the photodetectors' power taps is given by $$-2\times10 \log(1-K^2)$$

If the power taps directing optical power to the photodetectors are replaced with variable power taps (such as the one shown in FIG. 6A), the variable power taps can be set to tap a low amount of optical power to reduce the optical losses, but large enough for a sufficient signal to noise ratio, necessary for the cancellation of reflections and laser stabilization. The power coupling strength of the power taps can be monitored using additional photodetectors, or using the photodetectors already shown in the embodiment of FIG. 9.

Figure 13A:
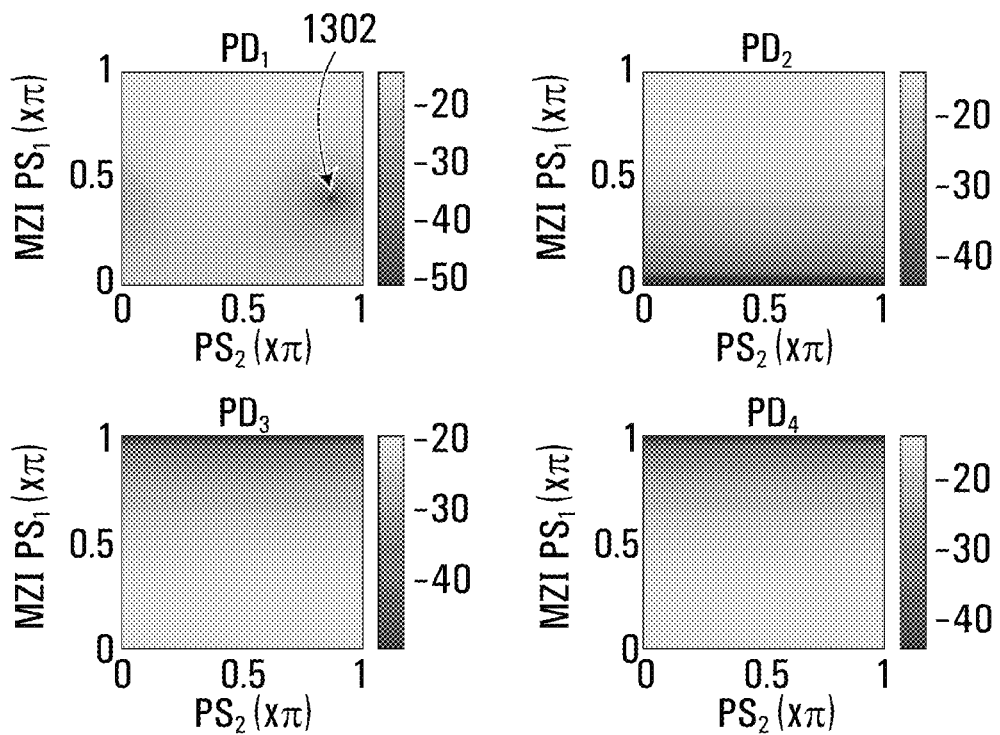
FIGS. 13A-16B depict the results of example simulations performed using the reflection cancellation circuit, according to additional example embodiments.
Figure 13B:
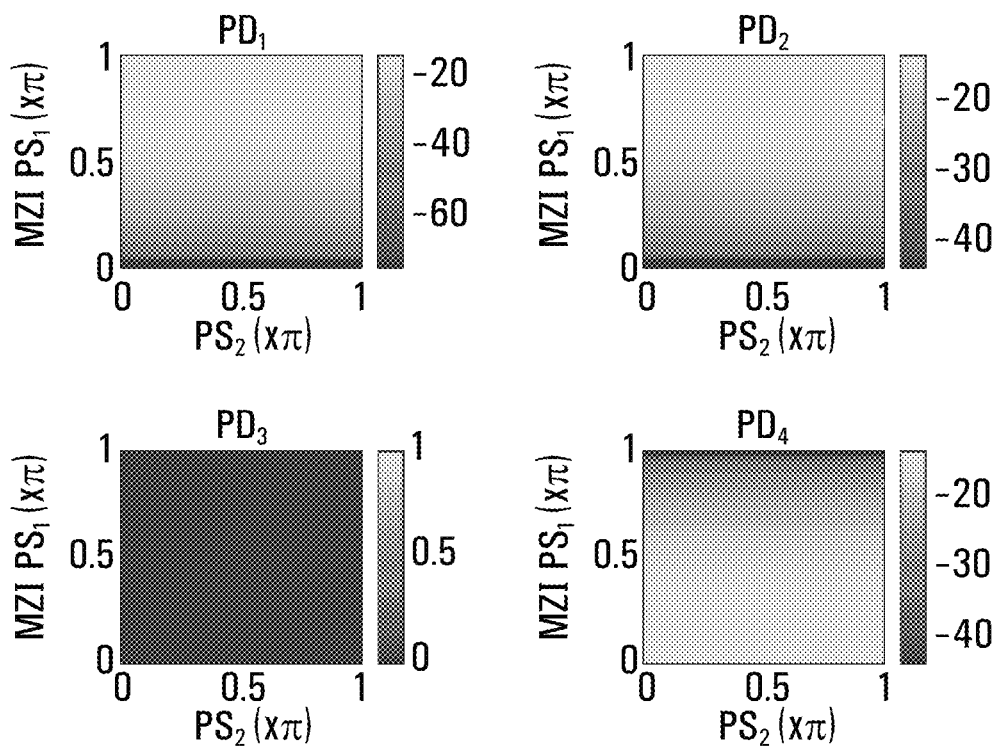
Figure 14A:
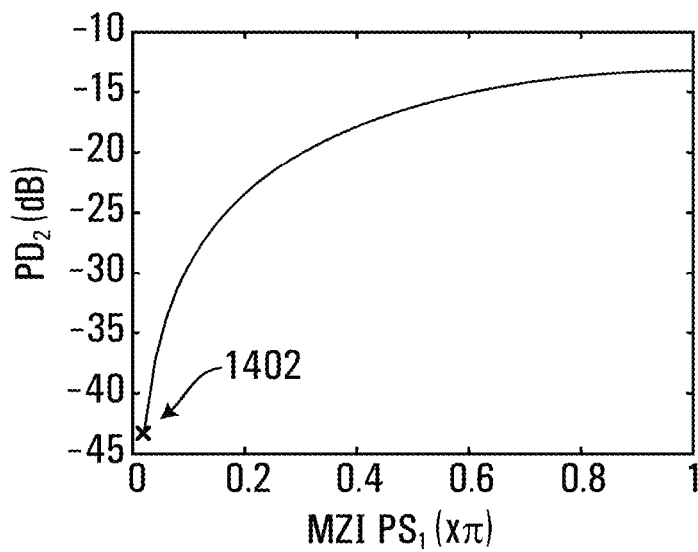
Figure 14B:
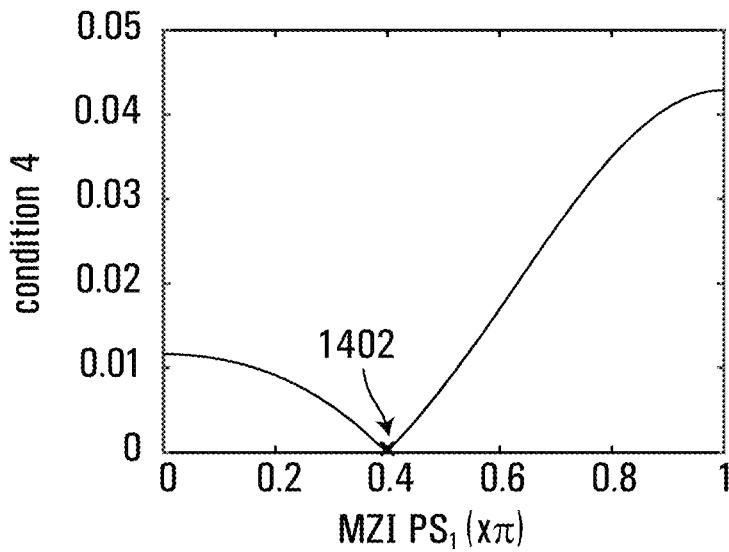
Figure 14C:
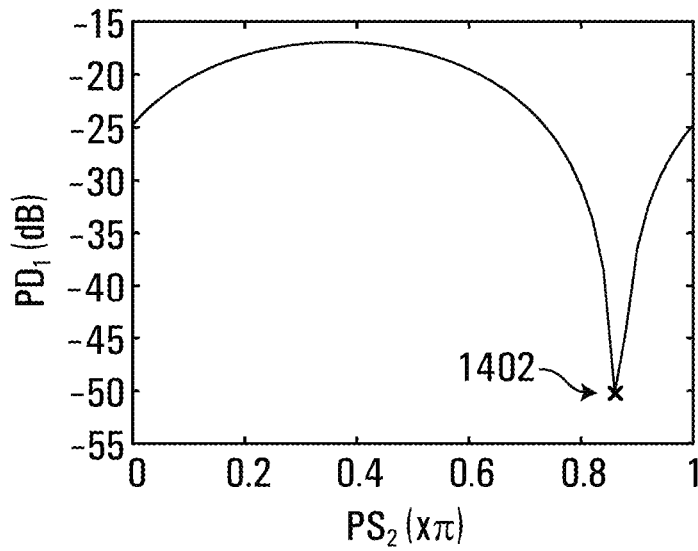
Figure 15:
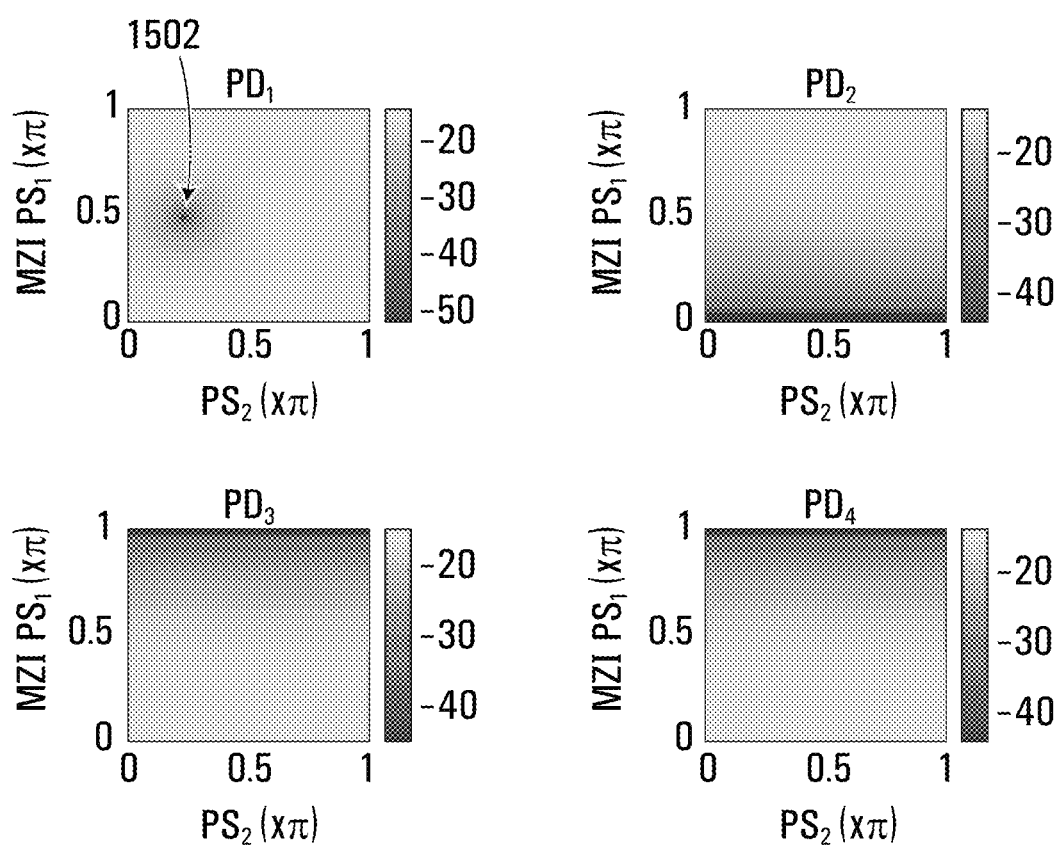
Figure 16A:
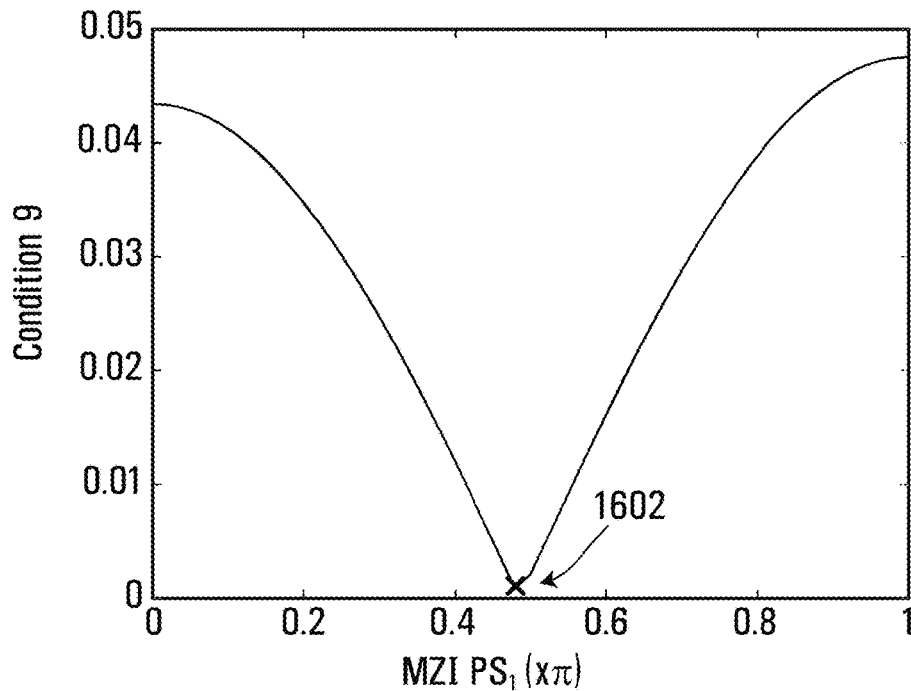
Figure 16B:
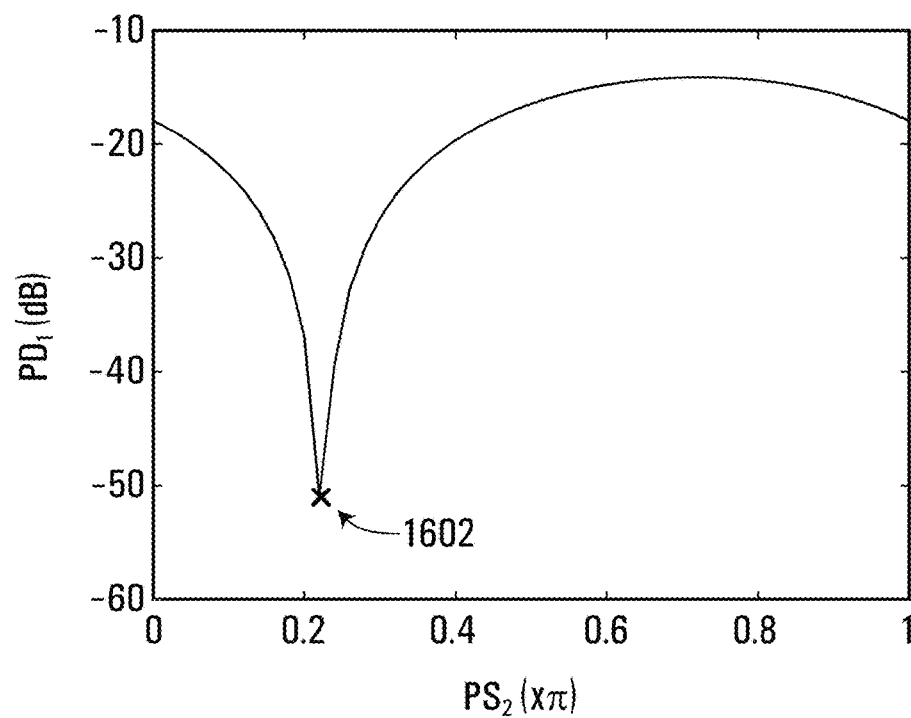

FIGS. 13A-16B depict the results of simulations performed on the system of FIG. 9. In these figures and the associated description, "MZI PS1" refers to the phase shift imparted by the MZI 602, thereby affecting the intensity of the feedback signal 208; "PS2" refers to the phase shift imparted by the phase shifter 212, thereby affecting the phase of the feedback signal 208; and PD1 through PD4 respectively represent the first through fourth photodetectors 704a-d. FIGS. 13A-14C depict results of applying the calibration phase 1102, while FIGS. 15-16B depict results of applying the dynamic cancellation phase 1104.

In FIG. 13A, a two-dimensional sweep (over PS1 and PS2) was implemented using ideal components. Each of PD1 through PD4 performed measurements using a 5% power tap of the optical power in the waveguide (while a 5% power tap is used in this example, different examples may use different power taps, such as 1%, 10%, or any suitable value greater than 0%, or even a tunable power tap with a variable power coupling strength). Since light passes twice through PS2, a 0 to π/2 tuning range is sufficient. In addition, since only a π-phase difference is required to switch the power between the output ports of the MZI 602, PS1 is also only tuned between 0 and π. First a two-dimensional sweep was obtained for the case when the parasitic reflection's 218 magnitude was set to 30%, and the attenuator 902 was set to off. The power at each of PD1 through PD4 was recorded, with each of PD1 through PD4 being separately graphed in FIG. 13A for various values of both phase shifters (PS1 and PS2).

On superficial inspection, it may appear from the PD1 two-dimensional sweep graph in FIG. 13A that a single-dimension minimum seeking method implemented across MZI PS1 followed by applying a single-dimension minimum seeking method across PS2 might reach a global minimum 1302. However, this is not the case since the MZI PS1 phase for maximum cancellation of the parasitic reflection 218 is dependent on the initial value of PS2. Applying the method 1100 of FIG. 11 addresses this issue by tapping from the laser output 202 power equal to the parasitic reflection's 218 magnitude. A single-dimension minimum seeking method over PS2 can then be implemented to reach the global minimum 1302.

FIG. 13B graphs each of PD1 through PD4 reading for various values of both phase shifters (PS1 and PS2), when the parasitic reflection's 218 magnitude was set to 30% and the attenuator 902 was turned on. Each of PD1 through PD4 performed measurements using a 5% power tap (while a 5% power tap is used in this example, different examples may use different power taps, such as 1%, 10%, or any suitable value between 0% and 100%, or even a tunable power tap with a variable power coupling strength). From these two sweeps, the calibration phase 1102 can be performed using the case when PS2=0 (a single-dimension sweep). FIGS. 14A-14C depict the results obtained from the two-dimensional sweeps of FIGS. 13A and 13B. More particularly, FIG. 14A is a graph of PD2 in dB vs. MZI PS1, with a condition met point 1402 indicating when $I_{PD2}$ is minimized at block 1108; FIG. 14B is a graph of the condition in block 1116 (corresponding to Equation (5)), with the condition met point 1402 indicating when block 1116 is satisfied; and FIG. 14C is a graph of PD1 in dB vs. PS2, with the condition met point 1402 indicating when bpi is minimized at block 1122. In practice, a single-dimension minimum seeking method can be used to set the MZI 602 and phase shifter 212 to adjust MZI PS1 and PS2 and arrive at the condition met points 1402 of FIGS. 14A-14C.

In FIG. 15, the Lumerical Interconnect™ simulation software was applied to simulate an example of 90% reflected power with the attenuator 902 off and using another Mach-Zehnder interferometer with a 35° phase shift as the device 216. Each of PD1 through PD4 performed measurements using a 5% power tap (while a 5% power tap is used in this example, different examples may use different power taps, such as 1%, 10%, or any suitable value between 0% and 100%, or even a tunable power tap with a variable power coupling strength). FIG. 15 shows the sweep results for PD1 through PD4. From FIG. 15, a single-dimension minimum-seeking method can then be implemented to satisfy the conditions of the dynamic cancellation phase 1104 and reach the global minimum 1502 shown in the PD1 graph of FIG. 15. FIGS. 16A and 16B depict the dynamic cancellation single-dimension sweep results. More particularly, FIG. 16A is a graph of the condition in block 1132 vs. changing MZI PS1 in block 1133, while FIG. 16B is a graph of PD1 in dB as considered at block 1128 (corresponding to Equation (6)) vs. PS2, which is adjusted at block 1134. FIGS. 14A-14C and 16A-16B show that the dynamic RCC 100 of FIG. 9 together with the method 1100 of FIG. 11 can indeed at least partially cancel the parasitic reflection 218 and reduce two-dimensional sweeps to a single-dimensional sweep to reach the global minimum 1502 of back reflected power into the laser 104.

Figure 17:
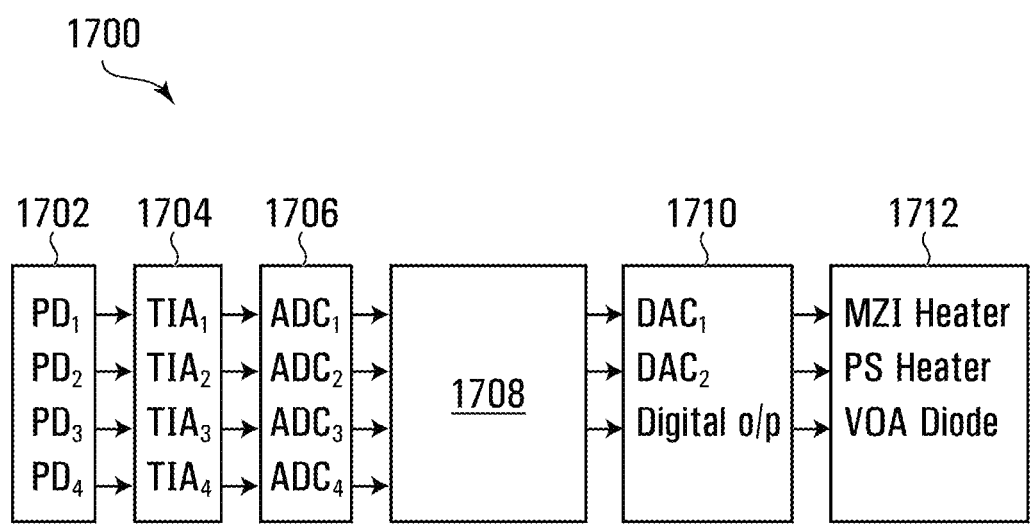
FIG. 17 depicts an electronic-photonic block diagram implementation of the reflection cancellation circuit.

The RCC 100 may be implemented using a digital circuit. FIG. 17 depicts an electronic-photonic block diagram 1700 implementation of the RCC 100 highlighting electronic circuit components. A first block 1702 comprises the first through fourth photodetectors 704a-d, which output $I_{PD1}$ through $I_{PD4}$. A second block 1704 comprises first through fourth trans-impedance amplifiers (each a "TIA") that receive and convert $I_{PD1}$ through $I_{PD4}$, respectively, to first through fourth voltages. The voltages are received by first through fourth analog-to-digital converters (each an "ADC") comprising a third block 1706, and are converted to digital signals that are received by a digital controller 1708. The digital controller 1708 is an example type of control circuit 214 and applies the functionality described above in respect of the control circuit 214, such as the method 1100 of FIG. 11. The digital controller 1708 accordingly thermally controls the phase shift imparted by the MZI 602 and phase shifter 212, and also controls the optical attenuator 902. Heaters that control the phase shifts of the MZI 602 and phase shifter 212 are respectively labeled "MZI Heater" and "PS Heater" in FIG. 17, while the optical attenuator 902 is labeled "VOA Diode" in FIG. 17; the heaters and attenuator 902 collectively comprise a fifth block 1712. First and second digital-to-analog converters (each a "DAC") convert digital control signals from the digital controller 1708 to analog control signals that are sent to the MZI Heater and PS Heater, while the digital output from the digital controller 1708 is transmitted with or without amplification or attenuation to the optical attenuator 902. The DACs and digital relay/amplification/attenuation comprise part of a fourth block 1710.

The digital controller 1708 may implement a one-dimensional minimum seeking method for control simplicity. Additionally, while FIG. 17 shows a digital implementation, in at least some alternative embodiments a completely analog implementation can be implemented without using ADCs, DACs, or digital control.

The above-described examples focus on silicon photonics products. However, in at least some other example embodiments, non-silicon platforms may be used. Example alternative platforms may comprise III-V platforms such as Indium Phosphide, or Silicon Nitride, or Glass Photonic Integrated Circuits.

The control circuit 214 used in the foregoing embodiments may be, for example, a processing unit (such as a processor, microprocessor, programmable logic controller, quantum computer, and/or optical signal processor) communicatively coupled to a non-transitory computer readable medium having stored on it program code for execution by the processing unit, microcontroller (which comprises both a processing unit and a non-transitory computer readable medium), field programmable gate array (FPGA), or an application-specific integrated circuit (ASIC). Examples of computer readable media are non-transitory and include disc-based media such as CD-ROMs and DVDs, magnetic media such as hard drives and other forms of magnetic disk storage, semiconductor based media such as flash media, random access memory (including DRAM and SRAM), and read only memory.

FIG. 11 is a flowchart of an example method. Some of the blocks in the flowchart may be performed in an order other than that which is described. Also, it should be appreciated that not all of the blocks described in the flowchart are required to be performed, that additional blocks may be added, and that some of the illustrated blocks may be substituted with other blocks.

The terminology used herein is for the purpose of describing particular embodiments only and is not intended to be limiting. Accordingly, as used herein, the singular forms "a", "an", and "the" are intended to include the plural forms as well, unless the context clearly indicates otherwise. It will be further understood that the terms "comprises" and "comprising", when used in this description, specify the presence of one or more stated features, integers, steps, operations, elements, and components, but do not preclude the presence or addition of one or more other features, integers, steps, operations, elements, components, and groups. Directional terms such as "top", "bottom", "upwards", "downwards", "vertically", and "laterally" are used in this description for the purpose of providing relative reference only, and are not intended to suggest any limitations on how any article is to be positioned during use, or to be mounted in an assembly or relative to an environment. Additionally, the term "couple" and variants of it such as "coupled", "couples", and "coupling" as used in this description are intended to include indirect and direct connections unless otherwise indicated. For example, if a first device is coupled to a second device, that coupling may be through a direct connection or through an indirect connection via other devices and connections. Similarly, if the first device is communicatively coupled to the second device, communication may be through a direct connection or through an indirect connection via other devices and connections. Additionally, the term "and/or" when used in this description in conjunction with a list of items means any one or more of those items. For example, "A, B, and/or C" means "any one or more of A, B, and C".

As used herein, a first device is further "downstream" an optical circuit relative to a second device comprising part of that circuit if light passes through the second device before reaching the first device; analogously, in this example, the second device is "upstream" of the first device.

It is contemplated that any part of any aspect or embodiment discussed in this specification can be implemented or combined with any part of any other aspect or embodiment discussed in this specification.

One or more example embodiments have been described by way of illustration only. This description is presented for purposes of illustration and description, but is not intended to be exhaustive or limited to the form disclosed. It will be apparent to persons skilled in the art that a number of variations and modifications can be made without departing from the scope of the claims.

The invention claimed is:

1. A reflection cancellation method, comprising:
   (a) tapping laser output from a laser;
   (b) generating a feedback signal by phase shifting a tapped portion of the laser output, wherein the feedback signal is out-of-phase with a parasitic reflection of the laser output;
   (c) directing the feedback signal to the laser such that the parasitic reflection and feedback signal are superpositioned, wherein a magnitude and a phase of the feedback signal are such that superposition of the feedback signal and the parasitic reflection results in a resulting signal of lower magnitude than the parasitic reflection entering the laser;
   (d) monitoring a magnitude of the resulting signal; and
   (e) reducing the magnitude of the resulting signal by adjusting at least one of the magnitude and the phase of the feedback signal in response to the monitoring.

2. The reflection cancellation method of claim 1, wherein adjusting the at least one of the magnitude and the phase of the feedback signal comprises adjusting an amount of the laser output that is tapped to generate the feedback signal in response to the monitoring.

3. The reflection cancellation method of claim 1 or 2, wherein adjusting the at least one of the magnitude and the phase of the feedback signal comprises adjusting a phase shift imparted to the feedback signal during the phase shifting.

4. The reflection cancellation method of claim 1 or 2, wherein one of the magnitude and the phase of the feedback signal is adjusted while the other of the magnitude and the phase of the feedback signal is held constant.

5. The reflection cancellation method of claim 1 or 2, wherein the magnitude and the phase of the feedback signal are concurrently adjusted.

6. The reflection cancellation method of claim 1 or 2, wherein the tapping is performed using a tunable tap that comprises a first output to a source of the parasitic reflection and a second output to a phase shifter that performs the phase shifting, and wherein the method further comprises:
   (a) as between the first and second outputs, directing the laser output entirely to the first output;
   (b) measuring a magnitude of the parasitic reflection entering the laser while the laser output is entirely directed to the first output;
   (c) attenuating the laser output downstream from the first output and upstream of the source of the parasitic reflection, without attenuating the tapped portion from the second output; and
   (d) while the laser output is being attenuated, tuning the magnitude of the feedback signal to approach the magnitude of the parasitic reflection measured while the laser output is entirely directed to the first output.

7. The reflection cancellation method of claim 6, wherein attenuating the laser output from the first output comprises preventing any of the laser output from reaching the source of the parasitic reflection, and wherein the magnitude of the feedback signal is tuned until the magnitude of the feedback signal equals the magnitude of the parasitic reflection measured while the laser output is entirely directed to the first output.

8. The reflection cancellation method of claim 6, wherein directing the laser output entirely to the first output comprises adjusting the tunable tap until a second photocurrent generated by measuring the feedback signal is minimized.

9. The reflection cancellation method of claim 8, wherein the magnitude of the feedback signal is tuned until a first photocurrent generated by measuring the resulting signal equals a value determined using:
   (a) the second photocurrent;
   (b) a fourth photocurrent generated by measuring the laser output from the first output to the source of the parasitic reflection:
      (i) during the tuning of the feedback signal; and
      (ii) when the second photocurrent is minimized; and
   (c) the first photocurrent when the second photocurrent is minimized.

10. The reflection cancellation method of claim 9, wherein the magnitude of the feedback signal is tuned until:

$$I_{PD_1} = \frac{a_1}{a_4} \frac{(I_{PD_4})^2}{I_{PD_2} + I_{PD_4}},$$

wherein $I_{PD1}$ is the first photocurrent, $I_{PD2}$ is the second photocurrent, $I_{PD4}$ is the fourth photocurrent during the tuning of the feedback signal, $a_1$ is the first photocurrent when the second photocurrent is minimized, and $a_4$ is the fourth photocurrent when the second photocurrent is minimized.

11. The reflection cancellation method of claim 1 or 2, wherein the tapping is performed using a tunable tap that comprises a first output to a source of the parasitic reflection and a second output to a phase shifter that performs the phase shifting, and wherein the method further comprises:
 (a) determining when a first photocurrent generated by measuring the resulting signal is above a minimum of the first photocurrent; and
 (b) when the first photocurrent generated by measuring the resulting signal is above the minimum of the first photocurrent, adjusting the tunable tap to tune the magnitude of the feedback signal.

12. The reflection cancellation method of claim 11, wherein the magnitude of the feedback signal is tuned by adjusting the tunable tap until a second photocurrent generated by measuring the feedback signal during the tuning of the feedback signal equals a value determined using:
 (a) a third photocurrent generated by measuring the parasitic reflection:
  (i) during the tuning of the feedback signal; and
  (ii) at the minimum of the first photocurrent;
 (b) a fourth photocurrent generated by measuring the laser output from the first output to the source of the parasitic reflection:
  (i) during the tuning of the feedback signal; and
  (ii) at the minimum of the first photocurrent; and
 (c) the second photocurrent generated at the minimum of the first photocurrent.

13. The reflection cancellation method of claim 12, wherein the magnitude of the feedback signal is tuned until:

$$I_{PD_2} = b_2 \sqrt{\frac{I_{PD_3} I_{PD_4}}{b_3 b_4}},$$

wherein $I_{PD2}$ is the second photocurrent during the tuning of the feedback signal, $b_2$ is the second photocurrent at the minimum of the first photocurrent, $b_3$ is the third photocurrent at the minimum of the first photocurrent, $b_4$ is the fourth photocurrent at the minimum of the first photocurrent, $I_{PD3}$ is the third photocurrent during the tuning of the feedback signal, and $I_{PD4}$ is the fourth photocurrent during the tuning of the feedback signal.

14. The reflection cancellation method of claim 11, further comprising, after tuning the magnitude of the feedback signal, tuning the phase of the feedback signal to approach the minimum of the first photocurrent.

15. The reflection cancellation method of claim 11, further comprising, before tuning the magnitude of the feedback signal, tuning the phase of the feedback signal to approach the minimum of the first photocurrent.

16. The reflection cancellation method of claim 14, wherein the phase of the feedback signal is tuned until the first photocurrent returns to the minimum of the first photocurrent.

17. The reflection cancellation method of claim 1 or 2, further comprising filtering the parasitic reflection before the parasitic reflection enters the laser using a filter tuned to a modulation frequency of the laser output and having a bandwidth of less than twice the modulation frequency.

18. A reflection cancellation circuit, comprising:
 (a) a tunable tap optically coupled to a laser to receive laser output therefrom;
 (b) a phase shifter optically coupled to the tunable tap to receive a tapped portion of the laser output;
 (c) a mirror optically coupled to the phase shifter and positioned to reflect a feedback signal back towards the laser;
 (d) a first photodetector optically coupled to monitor a magnitude of a resulting signal and generate a corresponding first photocurrent; and
 (e) a control circuit communicatively coupled to the tunable tap, the phase shifter, and the first photodetector, wherein the control circuit is configured to perform a method comprising:
  (i) tapping the laser output using the tunable tap;
  (ii) using the phase shifter, generating the feedback signal by phase shifting a tapped portion of the laser output, wherein a magnitude and a phase of the feedback signal are such that superposition of the feedback signal and the parasitic reflection results in the resulting signal, wherein the resulting signal is of lower magnitude than the parasitic reflection entering the laser; and
  (iii) in response to the first photocurrent, reducing the magnitude of the resulting signal by adjusting at least one of the magnitude and the phase of the feedback signal by respectively adjusting at least one of the tunable tap and the phase shifter.

19. The reflection cancellation circuit of claim 18, wherein the tunable tap comprises a Mach-Zehnder interferometer.

20. The reflection cancellation circuit of claim 18, wherein the tunable tap comprises a ring resonator.

21. The reflection cancellation circuit of claim 18, wherein the photodetector is optically coupled using a fixed tap.

22. The reflection cancellation circuit of claim 18, wherein the photodetector is optically coupled using a tunable power tap.

23. The reflection cancellation circuit of any one of claims 18 to 22, wherein the tunable tap comprises a first output to a source of the parasitic reflection and a second output to the phase shifter, and wherein the method further comprises:
 (a) determining when the first photocurrent is above a minimum of the first photocurrent; and
 (b) when the first photocurrent is above the minimum of the first photocurrent, adjusting the tunable tap to tune the magnitude of the feedback signal.

24. The reflection cancellation circuit of claim 18, wherein the photodetector is optically coupled using a tunable power tap and extra photodetectors are used to monitor the power coupling of the tunable power tap.

25. The reflection cancellation circuit of claim 22 or 24, wherein the tunable power tap for the photodetector comprises a Mach-Zehnder interferometer.

26. The reflection cancellation circuit of claim 22 or 24 wherein the tunable power tap for the photodetector comprises a ring resonator interferometer.

27. The reflection cancellation circuit of claim 26, wherein attenuating the laser output prevents any of the laser output from reaching the source of the parasitic reflection, and wherein the magnitude of the feedback signal is tuned until the magnitude of the feedback signal equals the magnitude of the parasitic reflection measured while the laser output is entirely directed to the first output.

28. The reflection cancellation circuit of claim 27, wherein the magnitude of the feedback signal is tuned until:

$$I_{PD_2} = b_2 \sqrt{\frac{I_{PD_3} I_{PD_4}}{b_3 b_4}},$$

wherein $I_{PD2}$ is the second photocurrent during the tuning of the feedback signal, $b_2$ is the second photocurrent at the minimum of the first photocurrent, $b_3$ is the third photocurrent at the minimum of the first photocurrent, $b_4$ is the fourth photocurrent at the minimum of the first photocurrent, $I_{PD3}$ is the third photocurrent during the tuning of the feedback signal, and $I_{PD4}$ is the fourth photocurrent during the tuning of the feedback signal.

29. The reflection cancellation circuit of claim 26, further comprising a second photodetector optically coupled between the tunable tap and the mirror to monitor a magnitude of the feedback signal and generate a corresponding second photocurrent, wherein the second photodetector and the control circuit are communicatively coupled, and wherein directing the laser output entirely to the first output comprises adjusting the tunable tap until the second photocurrent is minimized.

30. The reflection cancellation circuit of any one of claims 18 to 24, further comprising a filter tuned to a modulation frequency of the laser and optically coupled to filter the parasitic reflection before the parasitic reflection enters the laser, wherein the filter has a bandwidth of less than twice the modulation frequency.

31. The reflection cancellation circuit of any one of claims 18 to 24, wherein adjusting the at least one of the magnitude and the phase of the feedback signal comprises adjusting the tunable tap.

32. The reflection cancellation circuit of any one of claims 18 to 24, wherein adjusting the at least one of the magnitude and the phase of the feedback signal comprises adjusting a phase shift imparted to the feedback signal by the phase shifter.

33. The reflection cancellation circuit of claim 32, further comprising a fourth photodetector optically coupled between the first output and the source of the parasitic reflection to monitor the laser output from the first output to the source of the parasitic reflection and generate a corresponding fourth photocurrent, wherein the fourth photodetector is communicatively coupled to the control circuit, and wherein the magnitude of the feedback signal is tuned until the first photocurrent equals a value determined using:
 (a) the second photocurrent;
 (b) the fourth photocurrent:
  (i) during the tuning of the feedback signal; and
  (ii) when the second photocurrent is minimized; and
 (c) the first photocurrent when the second photocurrent is minimized.

34. The reflection cancellation circuit of claim 33, wherein the phase of the feedback signal is tuned until the first photocurrent returns to the minimum of the first photocurrent.

35. The reflection cancellation circuit of any one of claims 18 to 24, wherein one of the magnitude and the phase of the feedback signal is adjusted while the other of the magnitude and the phase of the feedback signal is held constant.

36. The reflection cancellation circuit of claim 35, wherein the magnitude of the feedback signal is tuned until:

$$I_{PD_1} = \frac{a_1}{a_4} \frac{(I_{PD_4})^2}{I_{PD_2} + I_{PD_4}},$$

wherein $I_{PD1}$ is the first photocurrent, $I_{PD2}$ is the second photocurrent, $I_{PD4}$ is the fourth photocurrent during the tuning of the feedback signal, $a_1$ is the first photocurrent when the second photocurrent is minimized, and $a_4$ is the fourth photocurrent when the second photocurrent is minimized.

37. The reflection cancellation circuit of any one of claims 18 to 24, wherein the magnitude and the phase of the feedback signal are concurrently adjusted.

38. The reflection cancellation circuit of any one of claims 18 to 24, wherein the tunable tap comprises a first output to a source of the parasitic reflection and a second output to the phase shifter, further comprising a first optical attenuator optically coupled between the first output and the source of the parasitic reflection, and wherein the method further comprises:
 (a) as between the first and second outputs, directing the laser output entirely to the first output;
 (b) using the first photodetector, measuring a magnitude of the parasitic reflection entering the laser while the laser output is entirely directed to the first output;
 (c) attenuating the laser output using the first optical attenuator; and
 (d) while the laser output is being attenuated, tuning the magnitude of the feedback signal using the tunable tap to approach the magnitude of the parasitic reflection measured while the laser output is entirely directed to the first output.

39. The reflection cancellation circuit of claim 38, further comprising:
 (a) a second photodetector optically coupled between the tunable tap and the mirror to monitor a magnitude of the feedback signal and generate a corresponding second photocurrent;
 (b) a third photodetector optically coupled between the first output and the source of the parasitic reflection to monitor the parasitic reflection and generate a corresponding third photocurrent;
 (c) a fourth photodetector optically coupled between the first output and the source of the parasitic reflection to monitor the laser output from the first output to the source of the parasitic reflection and generate a corresponding fourth photocurrent;
 wherein each of the second, third, and fourth photodetectors is each communicatively coupled to the control circuit, and wherein the magnitude of the feedback signal is tuned by adjusting the tunable tap until the second photocurrent equals a value determined using:
 (d) the third photocurrent:
  (i) during the tuning of the feedback signal; and
  (ii) at the minimum of the first photocurrent;
 (e) the fourth photocurrent:
  (i) during the tuning of the feedback signal; and
  (ii) at the minimum of the first photocurrent; and
 (f) the second photocurrent generated at the minimum of the first photocurrent.

40. The reflection cancellation circuit of claim 38, wherein the method further comprises, after tuning the magnitude of the feedback signal, tuning the phase of the feedback signal to approach the minimum of the first photocurrent.

41. The reflection cancellation circuit of claim 38, wherein the method further comprises, before tuning the magnitude of the feedback signal, tuning the phase of the feedback signal to approach the minimum of the first photocurrent.

42. A control circuit configured to perform the method of claim 1 or 2.

* * * * *